(12) United States Patent
Miyazawa et al.

(10) Patent No.: US 8,593,554 B2
(45) Date of Patent: Nov. 26, 2013

(54) SOLID-STATE IMAGING APPARATUS, CAMERA, AND METHOD OF MANUFACTURING SOLID-STATE IMAGING APPARATUS

(75) Inventors: Shinji Miyazawa, Kanagawa (JP); Takeshi Takeda, Kumamoto (JP)

(73) Assignee: Sony Corporation, Tokyo (JP)

( * ) Notice: Subject to any disclaimer, the term of this patent is extended or adjusted under 35 U.S.C. 154(b) by 692 days.

(21) Appl. No.: 12/585,604

(22) Filed: Sep. 18, 2009

(65) Prior Publication Data

US 2010/0097512 A1    Apr. 22, 2010

(30) Foreign Application Priority Data

Oct. 17, 2008    (JP) .................................. 2008-268544

(51) Int. Cl.
*H04N 5/335*    (2011.01)

(52) U.S. Cl.
USPC .......................................... 348/311; 257/231

(58) Field of Classification Search
USPC .......................................... 348/311; 257/231
See application file for complete search history.

(56) References Cited

U.S. PATENT DOCUMENTS

| | | | | |
|---|---|---|---|---|
| 5,442,396 | A * | 8/1995 | Nakashiba | 348/322 |
| 6,618,087 | B1 * | 9/2003 | Hokari et al. | 348/311 |
| 7,102,678 | B2 * | 9/2006 | Tamagawa | 348/311 |
| 7,589,777 | B2 * | 9/2009 | Takayama et al. | 348/323 |
| 7,714,404 | B2 * | 5/2010 | Onodera | 257/435 |
| 8,049,803 | B2 * | 11/2011 | Murayama | 348/311 |
| 2006/0125944 | A1 * | 6/2006 | Inuiya | 348/311 |
| 2008/0055449 | A1 * | 3/2008 | Nagase et al. | 348/311 |
| 2009/0250728 | A1 * | 10/2009 | Mizuno et al. | 257/225 |
| 2010/0171855 | A1 * | 7/2010 | Habara et al. | 348/294 |

FOREIGN PATENT DOCUMENTS

| | | |
|---|---|---|
| JP | 10-223876 | 8/1998 |
| JP | 2005-109021 | 4/2005 |
| JP | 2005-140411 | 6/2005 |

\* cited by examiner

*Primary Examiner* — James M Hannett
*Assistant Examiner* — Fayez Bhuiyan
(74) *Attorney, Agent, or Firm* — Rader, Fishman & Grauer PLLC

(57) ABSTRACT

A solid-state imaging apparatus includes a plurality of photoelectric conversion units configured to generate signal charge from light received at light-receiving surfaces thereof, the plurality of photoelectric conversion units being provided in the image-sensing area of a substrate; a charge reading unit configured to read signal charge generated by the photoelectric conversion units, a charge readout channel area thereof being provided in the image-sensing area of the substrate; a transfer register unit configured to transfer signal charge read from the plurality of photoelectric conversion units by the charge reading unit, a charge transfer channel area thereof being provided in the image-sensing area of the substrate; and a light-shielding unit that is provided in the image-sensing area of the substrate and that has an opening through which light is transmitted formed in an area corresponding to a light-receiving surface of a respective photoelectric conversion unit.

14 Claims, 19 Drawing Sheets

FIG. 3
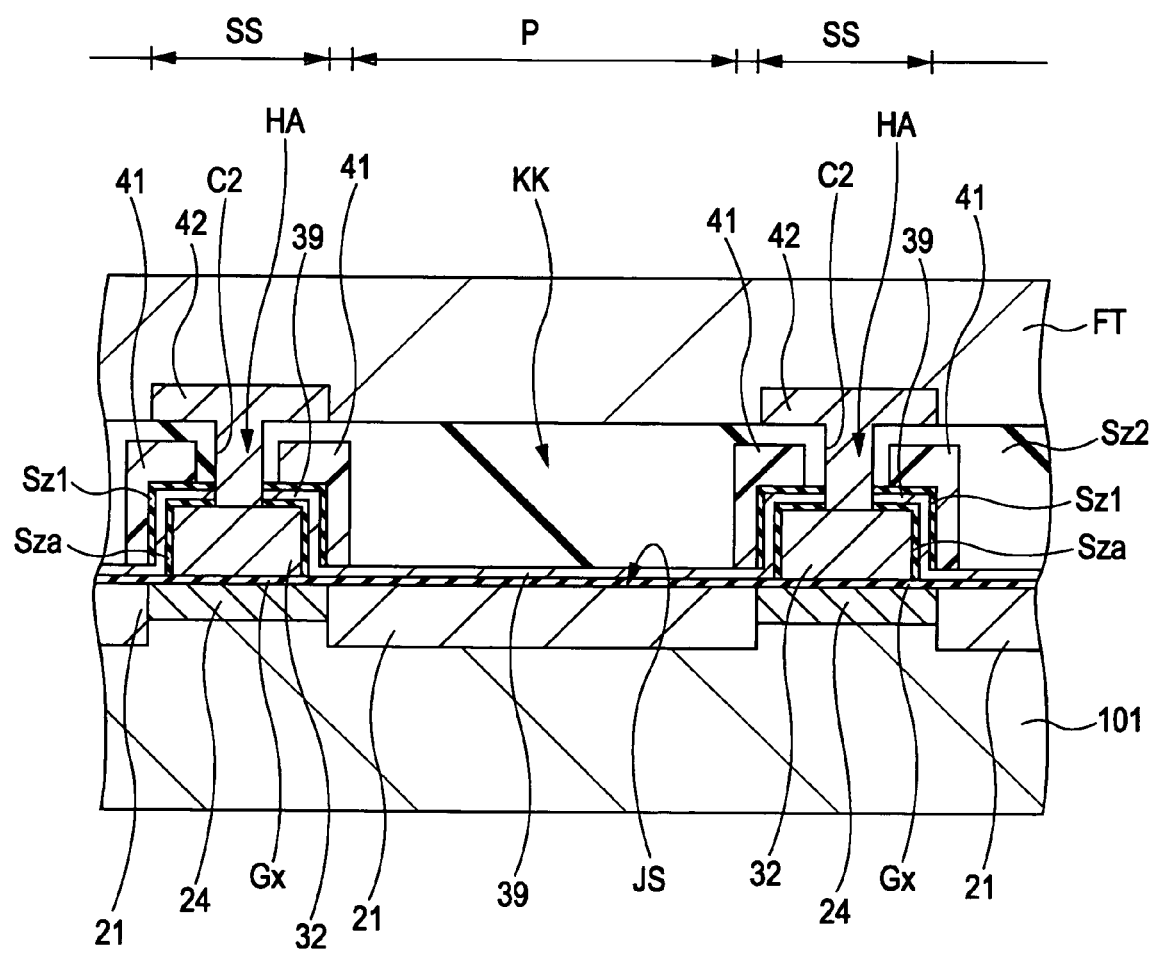
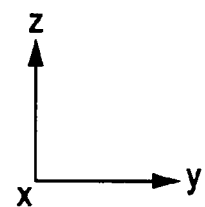

SOLID-STATE IMAGING APPARATUS, CAMERA, AND METHOD OF MANUFACTURING SOLID-STATE IMAGING APPARATUS

BACKGROUND OF THE INVENTION

1. Field of the Invention

The present invention relates to a solid-state imaging apparatus, a camera, and a method of manufacturing the solid-state imaging apparatus. In particular, the present invention relates to a solid-state imaging apparatus provided with a light-shielding unit such that an opening through which light is transmitted is formed in an area corresponding to the light-receiving surface of a photoelectric conversion unit in an image-sensing area of a substrate, to a camera, and to a method of manufacturing the solid-state imaging apparatus.

2. Description of the Related Art

Cameras, such as digital video cameras or digital still cameras, include a solid-state imaging apparatus. For example, such cameras have CCD (Charge Coupled Device) image sensors as solid-state imaging apparatuses.

In solid-state imaging apparatuses, an image-sensing area in which a plurality of pixels are arranged in a matrix in the horizontal direction and in the vertical direction is provided on the surface of a semiconductor substrate. In this image-sensing area, a plurality of photoelectric conversion units that receive light of an object image and generate signal charge by performing photoelectric conversion of the received light are formed so as to correspond to the plurality of pixels. For example, photodiodes are formed as these photoelectric conversion units.

Then, for example, in the case of a CCD image sensor, vertical transfer register units are provided between the columns of a plurality of photoelectric conversion units arranged in the vertical direction in the image-sensing area. The vertical transfer register unit is provided with a plurality of transfer electrodes that are provided so as to oppose a vertical transfer channel with a gate insulating film in a vertical transfer channel area provided therebetween, so that signal charge read from the photoelectric conversion unit by the charge reading unit is transferred in the vertical direction.

Then, the signal charge transferred for each horizontal line (pixels in one row) by the vertical transfer register unit is sequentially transferred in the horizontal direction by the horizontal transfer register unit, and the output unit outputs the signal charge. Furthermore, in order to prevent an occurrence of a problem, such as smearing, the image-sensing area is provided with a light-shielding film so as to prevent light from entering the vertical transfer register unit.

It has been proposed that, in this CCD image sensor, transfer electrodes are provided so as to function as charge reading electrodes. Here, transfer electrodes are formed so as to oppose a vertical transfer channel area and a charge readout channel area with a gate insulating film provided therebetween (see, for example, Japanese Unexamined Patent Application Publication No. 2005-140411 (Claim 1, FIGS. 2 to 5, etc.)).

Furthermore, it has been proposed that a light-shielding film is provided so as to have a function of a charge reading electrode in addition to the light-shielding function. Here, a light-shielding film is formed using a conductive material on a transfer electrode with an interlayer insulating film provided therebetween, and this light-shielding film is provided so as to include a portion opposing the electric charge readout channel area with the gate insulating film provided therebetween (see, for example, Japanese Unexamined Patent Application Publication No. 2005-109021 (Claim 1, FIGS. 2 to 4, etc.)).

In addition to this, it has been proposed that a light-shielding film is provided so as to function as a transfer electrode (see, for example, Japanese Unexamined Patent Application Publication No. 10-223876 (Claim 1, etc.)).

SUMMARY OF THE INVENTION

However, in a solid-state imaging apparatus, the cell size of each pixel decreases with an increasing number of pixels. As a result, there is a case in which the area of the light-receiving surface per pixel decreases, and the amount of received light decreases.

More specifically, in an image-sensing area, since reduction of an area other than the light-receiving surface is difficult, the reduction of the area of the light-receiving surface often becomes necessary. As a result, the above problem may occur.

For example, in the image-sensing area, the occupied area of the vertical transfer channel area that functions as a transfer path for signal charge is difficult to reduce for the purpose of securing transfer efficiency and saturation signals. Furthermore, there is a case in which a light-shielding film is difficult to form into a thin film for the purpose of securing a light-shielding characteristic. Furthermore, also, regarding an interlayer insulating film between the transfer electrode and the light-shielding film, there is a case in which the interlayer insulating film is difficult to form into a thin film for the purpose of securing an insulating characteristic.

For this reason, it is necessary for the area of the light-receiving surface to be reduced, and a problem of the proportion of sensitive electrons decreasing below the pixel reduction ratio may occur.

Therefore, in the solid-state imaging apparatus, there is a case in which the quality of a captured image is decreased.

Accordingly, it is desirable to provide a solid-state imaging apparatus capable of increasing the area of a light-receiving surface per pixel and improving the quality of a captured image, a camera, and a method of manufacturing the solid-state imaging apparatus.

According to an embodiment of the present invention, there is provided a solid-state imaging apparatus including: a plurality of photoelectric conversion units configured to generate signal charge from light received at light-receiving surfaces thereof, the plurality of photoelectric conversion units being provided in an image-sensing area of a substrate; a charge reading unit configured to read signal charge generated by the photoelectric conversion units, a charge readout channel area thereof being provided in the image-sensing area of the substrate; a transfer register unit configured to transfer signal charge read from the plurality of photoelectric conversion units by the charge reading unit, a charge transfer channel area thereof being provided in the image-sensing area of the substrate; and a light-shielding unit that is provided in the image-sensing area of the substrate and that has an opening through which light is transmitted formed in an area corresponding to a light-receiving surface of a respective photoelectric conversion unit, wherein the transfer register unit includes transfer electrodes that oppose the electric charge transfer channel area and the electric charge readout channel area with a gate insulating film provided therebetween in the image-sensing area of the substrate, wherein the light-shielding unit includes a conductive light-shielding film that covers the transfer electrodes in the image-sensing area of the substrate, that is formed using a conductive material so as to include a portion opposing the electric charge readout channel area with the gate insulating film provided therebetween, and that is electrically connected to the transfer electrodes, and wherein, in the charge reading unit, the transfer electrodes and the conductive light-shielding film are formed as charge reading electrodes and read signal charge from the photoelectric conversion units.

According to another embodiment of the present invention, there is provided a solid-state imaging apparatus including: a plurality of photoelectric conversion units configured to receive light at light-receiving surfaces thereof and generate signal charge by performing photoelectric conversion of the received light, the plurality of photoelectric conversion units being arranged in a horizontal direction and in a vertical direction in an image-sensing area of a substrate; a charge reading unit that has a plurality of electric charge readout channel areas provided so as to correspond to the plurality of photoelectric conversion units in the image-sensing area of the substrate and that reads signal charge generated by the photoelectric conversion units in the electric charge readout channel area; a transfer register unit that has a charge transfer channel area provided among the columns of the plurality of photoelectric conversion units arranged in the vertical direction in the image-sensing area of the substrate and that transfers, in the electric charge transfer channel area, signal charge read from each of the plurality of photoelectric conversion units by the charge reading unit in the vertical direction; and a light-shielding unit that is formed using a conductive material in the image-sensing area of the substrate and that has an opening through which light is transmitted provided in an area corresponding to a light-receiving surface of the photoelectric conversion unit, wherein the transfer register unit includes a first transfer electrode that opposes the electric charge transfer channel area and the electric charge readout channel area with a gate insulating film provided therebetween, and a second transfer electrode that opposes an area other than the area to which the first transfer electrode opposes in the electric charge transfer channel area, the first transfer electrode and the second transfer electrode being alternately arranged side by side in the vertical direction, and wherein the light-shielding unit includes a plurality of first light-shielding films that extend in a horizontal direction in such a manner as to correspond to each of the rows of the plurality of photoelectric conversion units arranged in the horizontal direction, that include a portion that opposing the electric charge readout channel area with a gate insulating film provided therebetween, that are electrically connected to the first transfer electrode, and that are arranged in the vertical direction with a slit therebetween, and a plurality of second light-shielding films that extend in the horizontal direction among the rows of the plurality of photoelectric conversion units arranged in the horizontal direction, that cover slits among the plurality of first light-shielding films, and that are electrically connected to the second transfer electrode, wherein the charge reading unit is formed in such a manner that the first transfer electrode and the first light-shielding film serve as charge reading electrodes so as to read signal charge from the photoelectric conversion units, and wherein the transfer register unit is formed in such a manner that the first light-shielding film, which serves as a charge transfer wire, transmits a driving signal to the first transfer electrode, and the second light-shielding film, which serves as a charge transfer wire, transmits a driving signal to the second transfer electrode.

According to another embodiment of the present invention, there is provided a camera including a plurality of photoelectric conversion units configured to generate signal charge from light received at light-receiving surfaces thereof, the plurality of photoelectric conversion units being provided in an image-sensing area of a substrate; a charge reading unit having a charge readout channel area provided in the image-sensing area of the substrate; a transfer register unit having a charge transfer channel area provided in the image-sensing area of the substrate; and a light-shielding unit that is provided in the image-sensing area of the substrate and that has an opening through which light is transmitted formed in an area corresponding to a light-receiving surface of a respective photoelectric conversion unit, wherein the transfer register unit includes transfer electrodes that oppose the electric charge transfer channel area and the electric charge readout channel area with a gate insulating film provided therebetween in the image-sensing area of the substrate, wherein the light-shielding unit includes a conductive light-shielding film that covers the transfer electrodes in the image-sensing area of the substrate, that is formed using a conductive material so as to include a portion opposing the electric charge readout channel area with the gate insulating film provided therebetween, and that is electrically connected to the transfer electrodes, and wherein, in the charge reading unit, the transfer electrodes and the conductive light-shielding film are formed as charge reading electrodes and read signal charge from the photoelectric conversion units.

According to another embodiment of the present invention, there is provided a method of manufacturing a solid-state imaging apparatus, the method including the steps of: forming, in an image-sensing area of a substrate, a plurality of photoelectric conversion units that receive light at light-receiving surfaces thereof and that generate signal charge by performing photoelectric conversion of the received light; forming, in the image-sensing area of the substrate, a charge reading unit that reads the signal charge generated by the photoelectric conversion units in the electric charge readout channel area; forming, in the image-sensing area of the substrate, a transfer register unit that transfers signal charge read from each of the plurality of photoelectric conversion units by the charge reading unit in the electric charge transfer channel area; and forming a light-shielding unit in the image-sensing area of the substrate so that an opening through which light is transmitted is formed in an area corresponding to the light-receiving surface of the photoelectric conversion unit, wherein the step of forming the transfer register unit includes a step of forming, in the image-sensing area of the substrate, transfer electrodes that oppose the electric charge transfer channel area and the electric charge readout channel area with a gate insulating film provided therebetween, and wherein the step of forming the light-shielding unit includes a step of forming a conductive light-shielding film that covers the transfer electrode in the image-sensing area of the substrate and that is electrically connected to the transfer electrode so as to include a portion that opposes the electric charge readout channel area with a gate insulating film provided therebetween.

According to the embodiments of the present invention, transfer electrodes opposing a charge transfer channel area and a charge readout channel area with a gate insulating film provided therebetween are formed in the image-sensing area of a substrate. Then, in the image-sensing area of the substrate, a conductive light-shielding film that is electrically connected to transfer electrodes is formed so as to include a portion that covers the transfer electrodes and that oppose the electric charge readout channel area with the gate insulating film provided therebetween.

According to the embodiments of the present invention, it is possible to provide a solid-state imaging apparatus, a camera, and a method of manufacturing the solid-state imaging apparatus that are capable of increasing the area of a light-receiving surface per pixel and improving the quality of a captured image.

BRIEF DESCRIPTION OF THE DRAWINGS

FIG. 3 shows the main part of the solid-state imaging apparatus 1 according to the first embodiment of the present invention;

DESCRIPTION OF THE PREFERRED EMBODIMENTS

Embodiments of the present invention will be described below with reference to the drawings.

The description will be given in the following order.
1. First Embodiment (Example in which second transfer electrode is formed above electrode first transfer electrode)
2. Second Embodiment (Example in which second transfer electrode is formed below first transfer electrode)
3. Third Embodiment (Example in which polysilicon film is formed on underside of first light-shielding film)

First Embodiment

Apparatus Configuration

Figure 1:
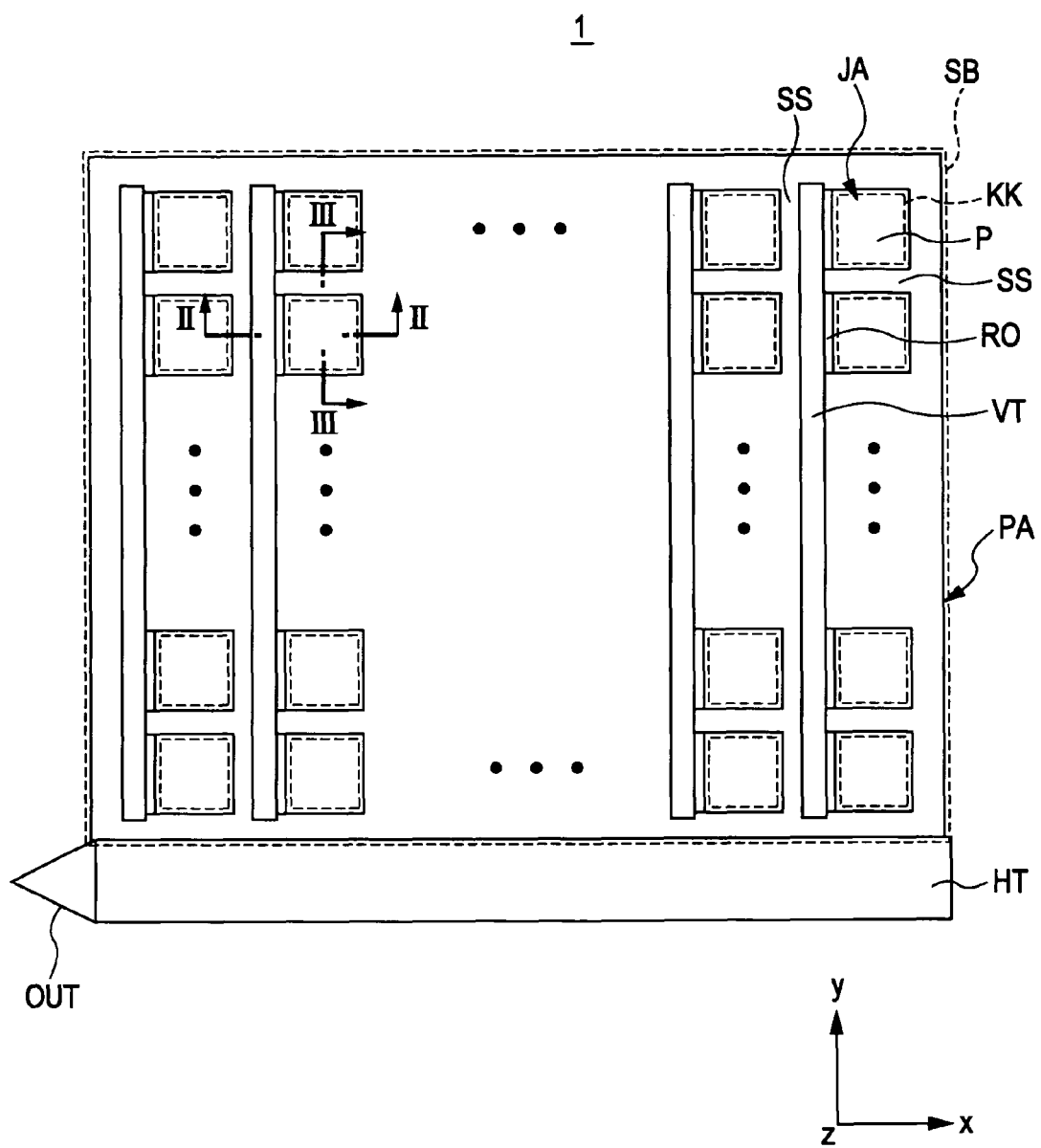
FIG. 1 is a plan view showing the outline of the entire solid-state imaging apparatus 1 according to a first embodiment of the present invention.

FIG. 1 is a plan view showing the outline of the entire configuration of a solid-state imaging apparatus 1 according to a first embodiment of the present invention.

As shown in FIG. 1, the solid-state imaging apparatus 1 is, for example, a CCD image sensor using an interline transfer method, with image capturing being performed in an image-sensing area PA.

In this image-sensing area PA, as shown in FIG. 1, photoelectric conversion units P, charge reading units RO, vertical transfer register units VT, and a light shielding unit SB are formed.

As shown in FIG. 1, a plurality of photoelectric conversion units P are provided in the image-sensing area PA, and these are arranged in a matrix in the horizontal direction x and in the vertical direction y. Then, in the surroundings of the plurality of photoelectric conversion units, element separation units SS are provided so as to separate the photoelectric conversion units P. Then, the photoelectric conversion units P are configured to receive light of an object image and perform photoelectric conversion of the received light in the photo-receiving area JA, thereby generating signal charge.

As shown in FIG. 1, a plurality of charge reading units RO are provided so as to correspond to a plurality of photoelectric conversion units P, so that signal charge generated by the photoelectric conversion unit P is read into the vertical transfer register units VT.

As shown in FIG. 1 the vertical transfer register units VT extend in the vertical direction y in such a manner as to correspond to a plurality of photoelectric conversion units P arranged in the vertical direction y in the image-sensing area PA. Furthermore, the vertical transfer register units VT is arranged among the columns of the photoelectric conversion units P arranged in the vertical direction y. A plurality of vertical transfer register units VT are provided in the image-sensing area PA, and the plurality of vertical transfer register units VT are arranged in the horizontal direction x in such a manner as to correspond to a plurality of photoelectric conversion units P. These vertical transfer register units VT are so-called vertical transfer CCDs, so that signal charge is read from the photoelectric conversion units P with charge reading units RO provided therebetween and the signal charge is sequentially transferred in the vertical direction y. Although details will be described later, in the vertical transfer register units VT, a plurality of transfer electrodes (not shown) are arranged side by side in the vertical direction y, and sequentially supply, for example, a four-phase drive pulse signal to the transfer electrodes arranged in the vertical direction, thereby performing the transfer of the signal charge.

As shown in FIG. 1, the light-shielding unit SB is provided so as to cover the entire image-sensing area PA in the image-sensing area PA. An opening KK is provided in a portion corresponding to the photo-receiving area JA of the photoelectric conversion unit P. The light-shielding unit SB is shown using the dotted line in FIG. 1 for the convenience of illustration.

Then, in the lower end portion of the image-sensing area PA, as shown in FIG. 1, a horizontal transfer register unit HT is arranged. This horizontal transfer register unit HT extends in the horizontal direction x, and each of the plurality of vertical transfer register units VT sequentially transfers, in the horizontal direction x, the signal charge transferred in the vertical direction y. That is, the horizontal transfer register unit HT is a so-called horizontal transfer CCD, is driven in accordance with a two-phase drive pulse signal, and transfers the transferred signal charge for each horizontal line (pixels of one row).

Then, as shown in FIG. 1, the left end portion of the horizontal transfer register unit HT is formed with an output unit OUT. This output unit OUT converts the signal charge that is horizontally transferred by the horizontal transfer register unit HT into a voltage so as to be output as an analog image signal.

The details of the solid-state imaging apparatus 1 will be described.

Figure 2:
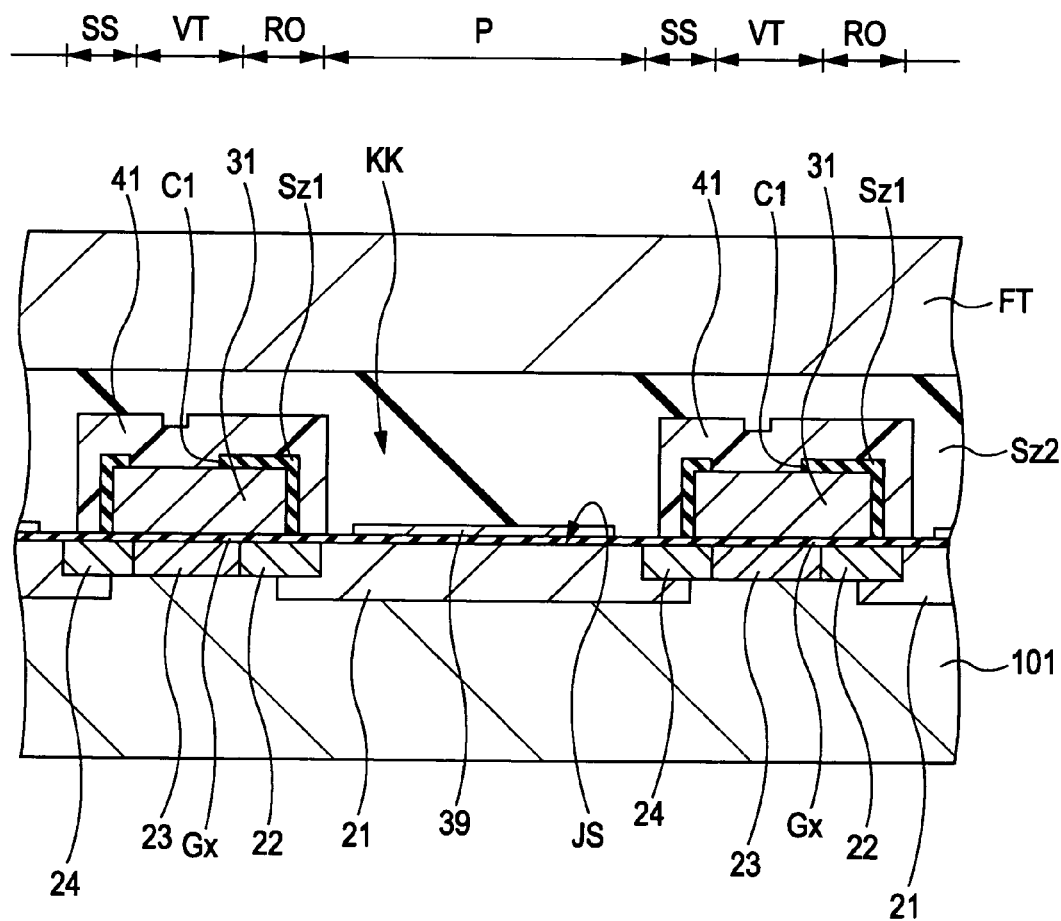
FIG. 2 shows the main part of the solid-state imaging apparatus 1 according to the first embodiment of the present invention.

FIGS. 2 and 3 show the main part of the solid-state imaging apparatus 1 according to the first embodiment of the present invention. Here, FIGS. 2 and 3 each show the cross section of the main part. FIG. 2 shows an II-II portion of FIG. 1 in an enlarged manner. FIG. 3 shows a portion of FIG. 1 in an enlarged manner.

As shown in FIGS. 2 and 3, the solid-state imaging apparatus 1 include a substrate 101. The substrate 101 is, for example, an n-type silicon semiconductor substrate. Inside the substrate 101, a photodiode 21, a charge readout channel area 22, a charge transfer channel area 23, and a channel stopper area 24 are provided. Then, on the surface of the substrate 101, as shown in FIGS. 2 and 3, a first transfer electrode 31, a second transfer electrode 32, a reflection prevention film 39, a first light-shielding film 41, and a second light-shielding film 42 are provided.

The units forming the solid-state imaging apparatus 1 will be described in sequence. As shown in FIGS. 2 and 3, the photodiode 21 is provided on the substrate 101 in such a manner as to correspond to a photoelectric conversion unit P. As shown in FIGS. 2 and 3, this photodiode 21 is configured to receive light on the light-receiving surface JS and generate signal charge by performing photoelectric conversion of the received light.

More specifically, the photodiode 21 is provided in a portion positioned at the obverse surface side inside the substrate 101. Although the illustration is omitted, the photodiode 21 is formed in such a manner that, for example, an n-type semiconductor area (n) (not shown) and a p-type semiconductor area ($p^+$) (not shown) are sequentially formed on a p-type semiconductor well area (p) (not shown) formed inside the substrate 101. Here, the n-type semiconductor area (n) functions as a signal charge storage area. Then, the p-type semiconductor area ($p^+$) is configured to function as a hole storage area and suppress the generation of dark current in the n-type semiconductor area (n), which is a signal charge storage area.

On the photodiode 21, furthermore, a planarization film FT is provided with an interlayer insulating film Sz2 provided therebetween. Although illustration is omitted, a color filter (not shown) and a microlens (not shown) are arranged on the planarization film FT. For this reason, the photodiode 21 receives, at its light-receiving surface JS, light that has entered through the microlens (not shown) and the color filter (not shown) in sequence.

As shown in FIG. 2, a charge readout channel area 22 is provided so as to correspond to a charge reading unit RO, so that signal charge generated by the photodiode 21 is read.

More specifically, as shown in FIG. 2, in a portion positioned at the obverse surface side inside the substrate 101, a charge readout channel area 22 is provided so as to be adjacent to the photodiode 21. Here, the electric charge readout channel area 22 is arranged to the left side of the photodiode 21 in the horizontal direction x. For example, the electric charge readout channel area 22 is formed as a p-type semiconductor area.

As shown in FIG. 2, the electric charge transfer channel area 23 is provided so as to correspond to the vertical transfer register unit VT, so that signal charge read from the photodiode 21 by the charge reading unit RO is transferred in the electric charge transfer channel area 23.

More specifically, as shown in FIG. 2, the electric charge transfer channel area 23 is provided so as to be adjacent to the electric charge readout channel area 22 in a portion positioned at the obverse surface side inside the substrate 101. Here, the electric charge transfer channel area 23 is arranged to the left side of the electric charge readout channel area 22 in the horizontal direction x. For example, the electric charge transfer channel area 23 is formed by providing an n-type semiconductor area (n) (not shown) in the p-type semiconductor well area (p) (not shown) inside the substrate 101.

As shown in FIGS. 2 and 3, a channel stopper area 24 is provided so as to correspond to an element separation unit SS, and separates a plurality of photodiodes 21 from each other.

More specifically, as shown in FIGS. 2 and 3, a channel stopper area 24 is provided in a portion positioned at the obverse surface side inside the substrate 101. As shown in FIG. 2, in the horizontal direction x, the channel stopper area 24 is provided to the left side of the electric charge readout channel area 22 so as to be provided between the electric charge readout channel area 22 and the photodiode 21 arranged in the adjacent column. Then, in the vertical direction y, as shown in FIG. 3, the channel stopper area 24 is provided between two photodiodes 21 arranged in the vertical direction y. The channel stopper area 24 is formed by providing, for example, a p-type semiconductor area ($p^+$) (not shown) on a p-type semiconductor well area (p) (not shown) inside the substrate 101, so that a potential barrier is formed to prevent flow-in/flow-out of signal charge.

As shown in FIGS. 2 and 3, the first transfer electrode 31 and the second transfer electrode 32 are provided so as to oppose each other via a gate insulating film Gx provided therebetween on the surface of the substrate 101. Both the first transfer electrode 31 and the second transfer electrode 32 are formed using a conductive material. For example, both the first light-shielding film 41 and the second light-shielding film 42 are formed using a conductive material, such as polysilicon, and are provided on the gate insulating film Gx formed using a silicon oxide film.

Figure 4:
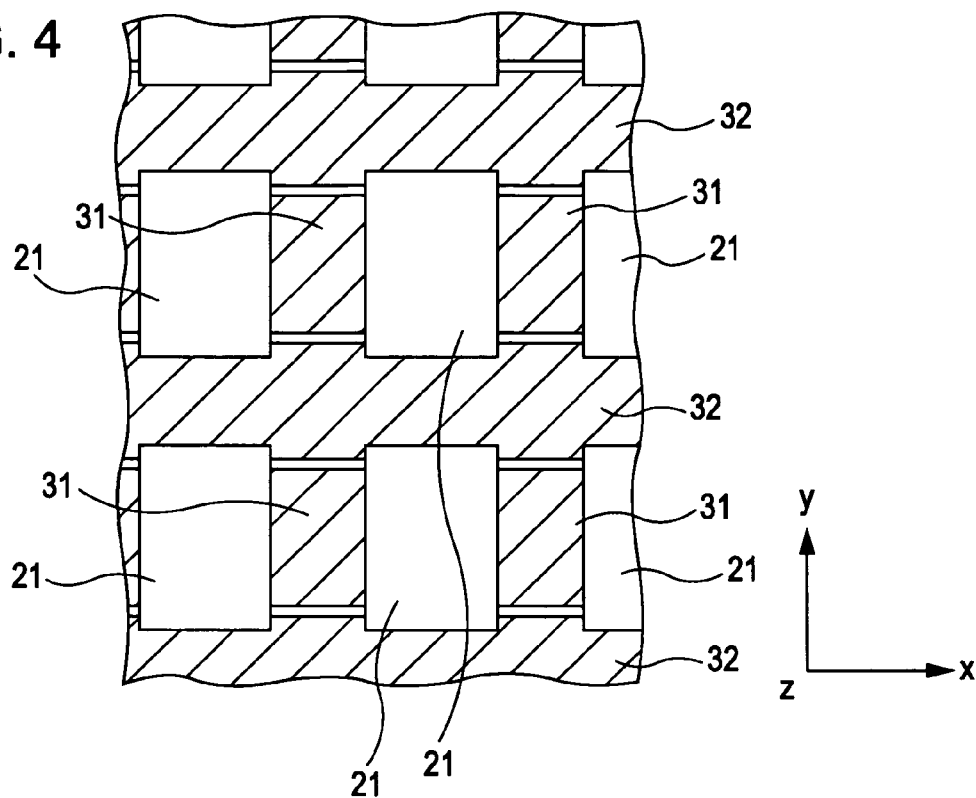
FIG. 4 is a top plan view showing a first transfer electrode 31 and a second transfer electrode 32 in an enlarged manner, which are provided on the surface of the substrate 101, according to the first embodiment of the present invention.

FIG. 4 is a top plan view showing the first transfer electrode 31 and the second transfer electrode 32 in an enlarged manner, which are provided on the surface of the substrate 101, according to the first embodiment of the present invention.

As shown in FIG. 4, on the top surface of the substrate 101, a plurality of first transfer electrodes 31 and a plurality of second transfer electrodes 32 are provided in such a manner as to be alternately arranged side by side in the vertical direction y.

Here, as shown in FIG. 4, the first transfer electrodes 31 are provided so as to be provided between the plurality of photodiodes 21 arranged in the horizontal direction x. Furthermore, the second transfer electrodes 32 are provided so as to extend in the horizontal direction x between the plurality of photodiodes 21 arranged in the vertical direction y.

More specifically, as shown in FIG. 2, the first transfer electrodes 31 are provided so as to oppose the electric charge readout channel area 22, the electric charge transfer channel area 23, and the channel stopper area 24 with the gate insulating film Gx provided therebetween in the cross section in the horizontal direction x. That is, the first transfer electrodes 31 are provided so as to correspond to the area in which the charge reading unit RO, the vertical transfer register unit VT, and the element separation unit SS are provided on the substrate 101. Here, in the horizontal direction x, the first transfer electrodes 31 oppose a portion positioned to the left side of the electric charge readout channel area 22 and do not oppose a portion positioned to the right side thereof. Furthermore, the first transfer electrodes 31 oppose the entire electric charge transfer channel area 23 in the horizontal direction x. Then, in the horizontal direction x, the first transfer electrodes 31 oppose a portion positioned to the right side of the channel stopper area 24, and do not oppose a portion positioned to the left side thereof.

On the other hand, as shown in FIG. 3, the second transfer electrodes 32 are provided so as to oppose the channel stopper area 24 with the gate insulating film Gx provided therebetween in the cross section in the vertical direction y. That is, as shown in FIG. 3, the second transfer electrodes 32 are provided so as to correspond to the element separation unit SS. Here, in the horizontal direction x, the second transfer electrodes 32 oppose the central portion of the channel stopper area 24 provided in the element separation unit SS, and do not oppose both-end portions positioned on the right and left sides. Although illustration is omitted, the second transfer electrodes 32 oppose the electric charge transfer channel area 23 extending in the vertical direction in a portion (see FIG. 4) in which the first transfer electrodes 31 are provided in the vertical direction y.

As shown in FIGS. 2 and 3, the reflection prevention film 39 is provided on the surface of the substrate 101. The reflection prevention film 39 is formed using, for example, a silicon-nitride film, and prevents incident light from being reflected.

Figure 5:
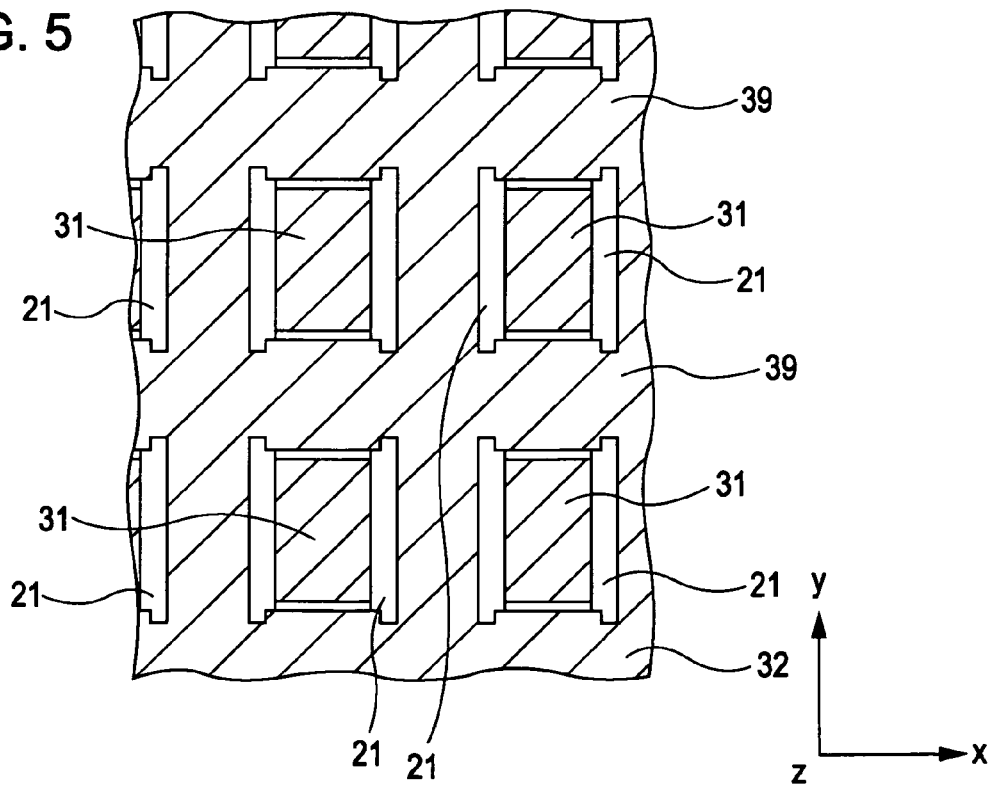
FIG. 5 is a top plan view showing a reflection prevention film 39 in an enlarged manner, which is provided on the surface of the substrate 101, according to the first embodiment of the present invention.

FIG. 5 is a top plan view showing the reflection prevention film 39 in an enlarged manner, which is provided on the surface of the substrate 101, according to the first embodiment of the present invention.

As shown in FIG. 5, on the top surface of the substrate 101, the reflection prevention film 39 is provided so as to include a portion provided between the plurality of photodiodes 21 arranged in the horizontal direction x. That is, the reflection prevention film 39 is provided on the second transfer electrodes 32. Furthermore, the reflection prevention film 39 is provided so as to cover the area positioned in the central portion on the plurality of photodiodes 21 arranged in the vertical direction y and extend.

More specifically, in the cross section in the horizontal direction x, as shown in FIG. 2, the reflection prevention film 39 is provided over the central portion on the light-receiving surface JS of the photodiode 21.

Furthermore, in the cross section in the vertical direction y, as shown in FIG. 3, the reflection prevention film 39, together with the light-receiving surface JS of the photodiode 21, are provided so as to cover the second transfer electrodes 32 with an insulating film Sza provided therebetween.

As shown in FIGS. 2 and 3, the first light-shielding film 41 and the second light-shielding film 42 are provided so as to cover at least one of the first transfer electrode 31 and the second transfer electrode 32 on the surface of the substrate 101. Both the first light-shielding film 41 and the second light-shielding film 42 are light-shielding materials that causes light to be shielded and are formed using a conductive material. For example, both the first light-shielding film 41 and the second light-shielding film 42 are formed using a metal material, such as tungsten. The first light-shielding film 41 and the second light-shielding film 42 constitute the light-shielding unit SB shown in FIG. 1.

Figure 6:
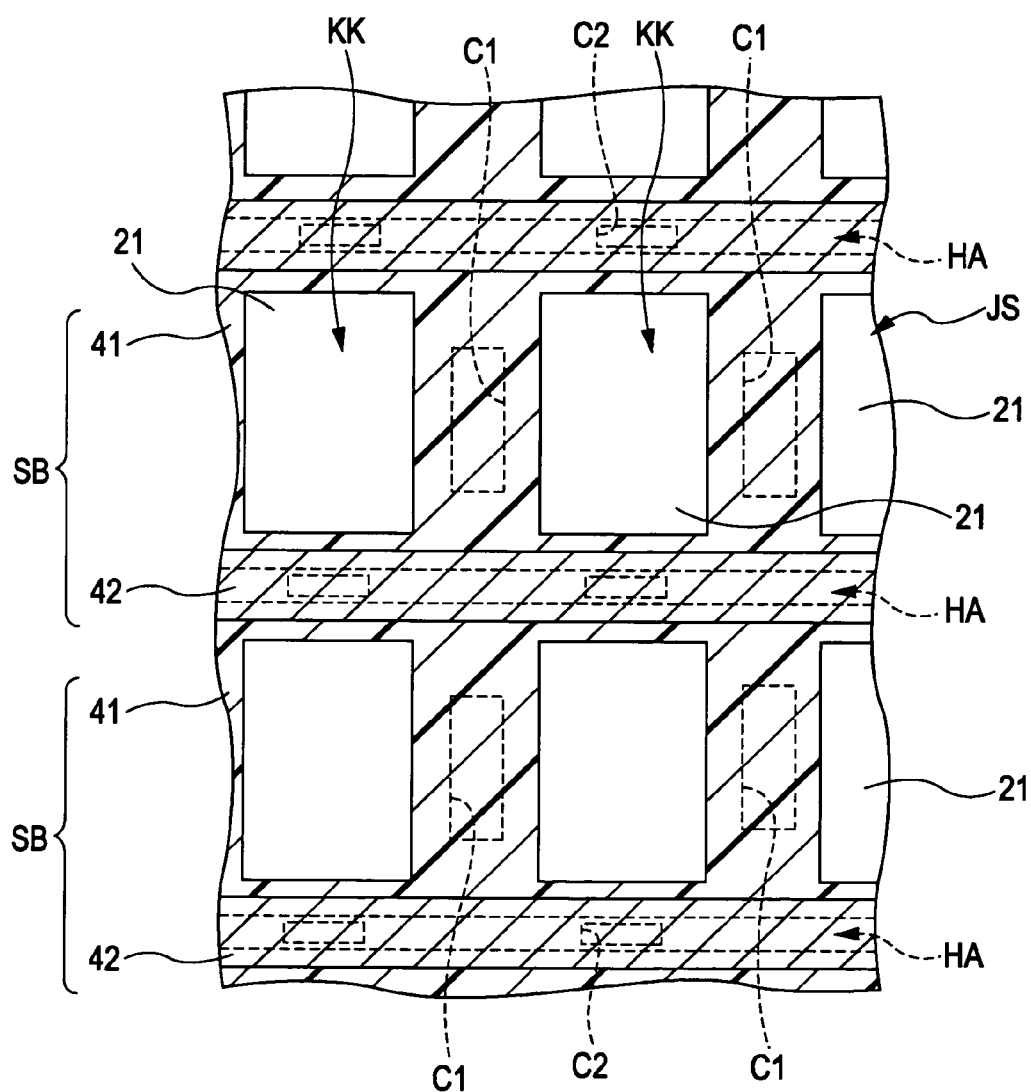
FIG. 6 is a top plan view showing a first light-shielding film 41 and a second light-shielding film 42 in an enlarged manner, which are provided on the surface of the substrate 101, according to the first embodiment of the present invention.

FIG. 6 is a top plan view showing the first light-shielding film 41 and the second light-shielding film 42 in an enlarged manner, which are provided on the surface of the substrate 101, according to the first embodiment of the present invention. In FIG. 6, for the convenience of description, the photodiode 21 is shown in addition to the first light-shielding film 41 and the second light-shielding film 42, and descriptions of the remaining members are omitted.

As shown in FIG. 6, on the top surface of the substrate 101, a plurality of first light-shielding films 41 and a plurality of second light-shielding films 42 are provided in such a manner as to be alternately arranged side by side at intervals in the vertical direction y.

Here, as shown in FIG. 6, the first light-shielding film 41 extends in the horizontal direction x so as to correspond to the rows of the plurality of photodiodes 21 arranged in the horizontal direction x, with an opening KK formed therein. Then, the plurality of first light-shielding films 41 are arranged in the vertical direction y with a slit HA therebetween. On the other hand, the second light-shielding film 42 is provided so as to extend in the horizontal direction x among a plurality of photodiodes 21 arranged in the vertical direction y. That is, the second light-shielding film 42 is provided so as to cover the slit HA positioned between the plurality of first light-shielding films 41 and also extend in the horizontal direction x among the plurality of photodiodes 21 arranged in the horizontal direction x.

More specifically, as shown in FIG. 2, in the cross section of the horizontal direction x, the first light-shielding film 41 is provided so as to cover the first transfer electrode 31. Here, the first light-shielding film 41 is provided so as to cover the side surface and the top surface of the first transfer electrode 31 with the insulating film Sz1 provided therebetween, which covers the first transfer electrode 31. Then, on the top surface of the first transfer electrode 31, the first light-shielding film 41 is electrically connected to the first transfer electrode 31 via a contact C1 provided so as to go through the insulating film Sz1. Furthermore, the top surface and the side surface of the first light-shielding film 41 are covered by an interlayer insulating film Sz2.

In the present embodiment, as shown in FIG. 2, the first light-shielding film 41 is provided so as to include a portion that opposes the electric charge readout channel area 22 with the gate insulating film Gx provided therebetween in the horizontal direction x. Here, in the first light-shielding film 41, a side wall is provided with the insulating film Sz1 therebetween on the right side surface of the first transfer electrode 31, and the under surface of the side wall on the right side opposes the electric charge readout channel area 22 with the gate insulating film Gx provided therebetween.

Furthermore, in the present embodiment, as shown in FIG. 2, the first light-shielding film 41 is provided so as to include a portion opposing the channel stopper area 24 with the gate insulating film Gx provided therebetween in the horizontal direction x. Here, in the first light-shielding film 41, a side wall is provided with the insulating film Sz1 therebetween on the left side surface of the first transfer electrode 31, and the under surface of the side wall on the left side opposes the channel stopper area 24 with the gate insulating film Gx provided therebetween.

Furthermore, in the cross section of the vertical direction y, as shown in FIG. 3, the first light-shielding film 41 is provided so as to cover the second transfer electrode 32. Here, the first light-shielding film 41 is electrically insulated from the second transfer electrode 32 by the layers Sza, 39, and Sz1 that cover the second transfer electrode 32, and are provided so as to cover the side surface and the top surface of the second transfer electrode 32 with the layers Sza, 39, and Sz1 provided therebetween. Then, the top surface and the side surface of the first light-shielding film 41 are covered with the interlayer insulating film Sz2.

On the other hand, as shown in FIG. 3, the second light-shielding film 42 is provided on the second transfer electrode 32 in the cross section of the vertical direction y. Here, as shown in FIG. 3, the second light-shielding film 42 extends in the horizontal direction x, and is provided so as to be positioned on the first light-shielding film 41 with the interlayer insulating film Sz2 provided therebetween. Then, in the second light-shielding film 42, a contact C2 is provided so as to extend in the vertical direction y, and is formed so as to include a portion in which the cross section is T-shaped. The contact C2 is provided so as to go through the layers Sza, 39, Sz1, and Sz2 that cover the second transfer electrode 32 and are electrically connected to the second transfer electrode 32.

When signal charge is to be read by the charge reading unit RO from the photodiode 21 provided in the photoelectric conversion unit P in the solid-state imaging apparatus 1, the first transfer electrode 31 and the first light-shielding film 41 are used as charge reading electrodes.

More specifically, by supplying a read voltage of the same potential to both the first transfer electrode 31 and the first light-shielding film 41, signal charge is read from the photodiode 21 in the readout channel area 22. Here, since the first transfer electrode 31 and the first light-shielding film 41 are electrically connected to each other, it is possible to supply a read voltage of the same potential to them. For this reason, the potential barrier formed by the electric charge readout area 22 between the photodiode 21 and the electric charge transfer channel 23 is decreased by the read voltage, and reading of the signal charge is performed.

Furthermore, in the solid-state imaging apparatus 1, when the signal charge read by the charge reading unit RO is to be transferred in the vertical direction y in the vertical transfer register units VT, the first light-shielding film 41 and the second light-shielding film 42 are used as electric charge transfer wires.

More specifically, as shown in FIG. 6, by transmitting, for example, four-phase drive pulse signals $\phi V1$, $\phi V2$, $\phi V3$, and $\phi V4$ to the first light-shielding film 41 and the second light-shielding film 42 arranged in the vertical direction y, the signal charge is transferred in the vertical direction y by the vertical transfer register units VT. Here, the first light-shielding film 41 is electrically connected to the first transfer electrode 31, and the second light-shielding film 42 is electrically connected to the second transfer electrode 32. Then, both the first light-shielding film 41 and the second light-shielding film 42 are electrically insulated from each other. For this reason, it is possible for the first light-shielding film 41 to transmit a drive pulse signal to the first transfer electrode 31. Also, it is possible for the second light-shielding film 42 to transmit a driving signal to the second transfer electrode 32. As a result, it is possible to transfer, for each horizontal line, the signal charge in sequence in the vertical direction y.

Figure 7:
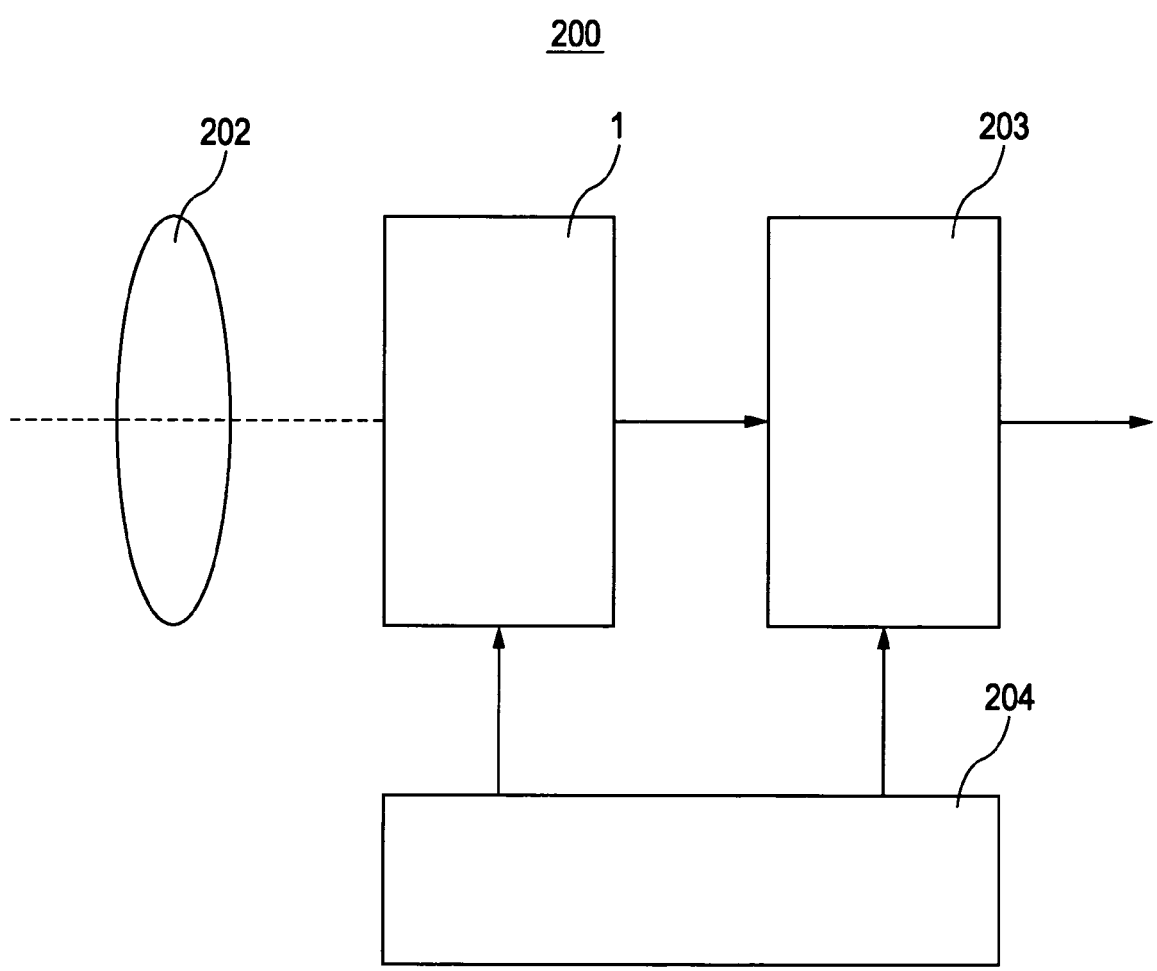
FIG. 7 is a block diagram showing the configuration of a camera 200 according to the first embodiment of the present invention.

FIG. 7 is a block diagram showing the configuration of a camera 200 according to the first embodiment of the present invention.

As shown in FIG. 7, the camera 200 includes, in addition to the above-described solid-state imaging apparatus 1, an optical system 202, a driving circuit 203, and a signal processing circuit 204.

The optical system 202 includes, for example, an optical lens, and causes an object image to be formed as an image on the image-capturing plane of the solid-state imaging apparatus 1.

The driving circuit 203 outputs various kinds of driving signals to the solid-state imaging apparatus 1 and the signal processing circuit 204, so that the solid-state imaging apparatus 1 and the signal processing circuit 204 are driven.

The signal processing circuit 204 generates a digital image of the object image by performing signal processing on raw data output from the solid-state imaging apparatus 1.

Manufacturing Method

A description will be given below of a method of manufacturing the solid-state imaging apparatus 1.

FIGS. 8 to 15 show main parts provided in each step of the method of manufacturing the solid-state imaging apparatus 1 according to the first embodiment of the present invention. Here, similarly to FIG. 2, FIGS. 8, 10, 12, and 14 each show a cross section showing a portion corresponding to an II-II portion of FIG. 1 in an enlarged manner. Similarly to FIG. 3, FIGS. 9, 11, 13, and 15 each show a cross section showing a portion corresponding to a portion of FIG. 1 in an enlarged manner.

Figure 8:
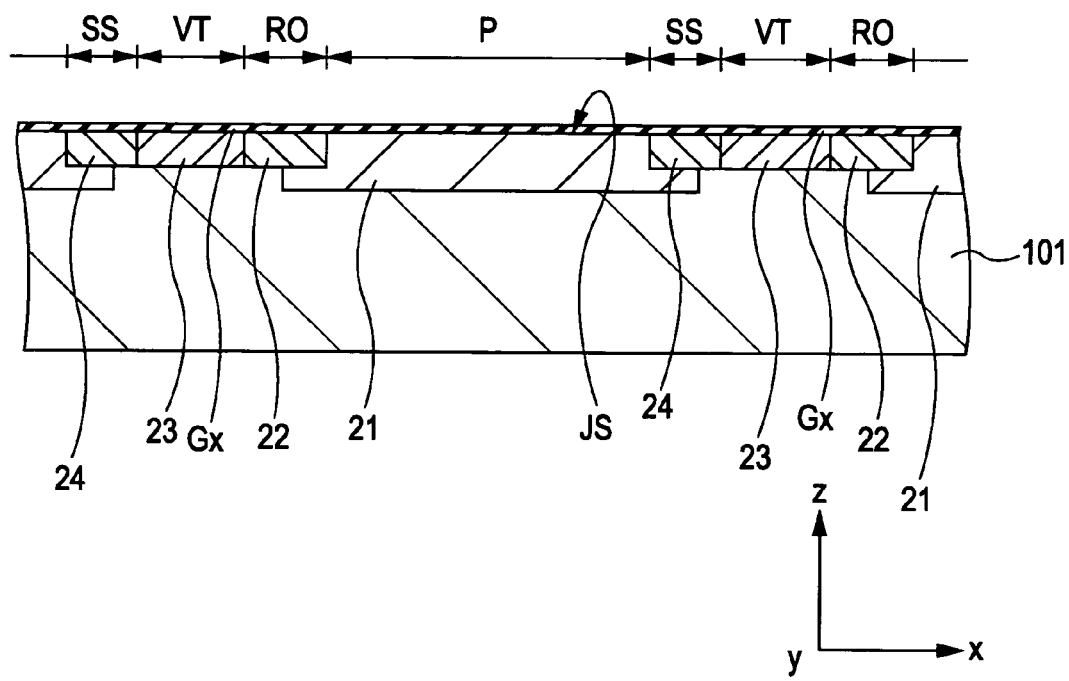
FIG. 8 shows the main part provided in each step of the method of manufacturing the solid-state imaging apparatus 1 according to the first embodiment of the present invention.
Figure 9:
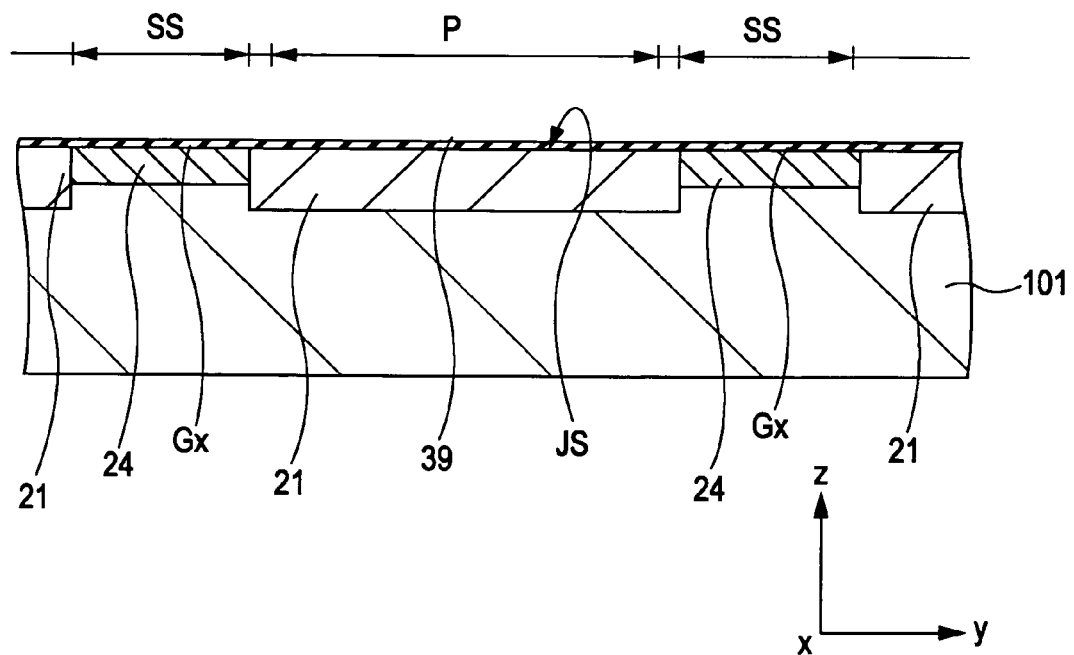
FIG. 9 shows the main part provided in each step of the method of manufacturing the solid-state imaging apparatus 1 according to the first embodiment of the present invention.

First, as shown in FIGS. 8 and 9, a gate insulating film Gx is formed.

At this point, prior to forming the gate insulating film Gx, a photodiode 21, a charge readout channel area 22, a charge transfer channel area 23, and a channel stopper area 24 are provided on the substrate 101. For example, by doping an impurity into the substrate 101 by using an ion implantation process, each unit is formed.

After that, for example, by providing a silicon oxide film on the entire surface of the substrate 101 by using a thermal oxidation method, the gate insulating film Gx is formed.

More specifically, as shown in FIG. 8, in the cross section in the horizontal direction x, the gate insulating film Gx is formed so as to cover the photodiode 21, the electric charge readout channel area 22, the electric charge transfer channel area 23, and the channel stopper area 24. Then, as shown in FIG. 9, in the cross section in the vertical direction y, the gate insulating film Gx is formed so as to cover the photodiode 21 and the channel stopper area 24.

Figure 10:
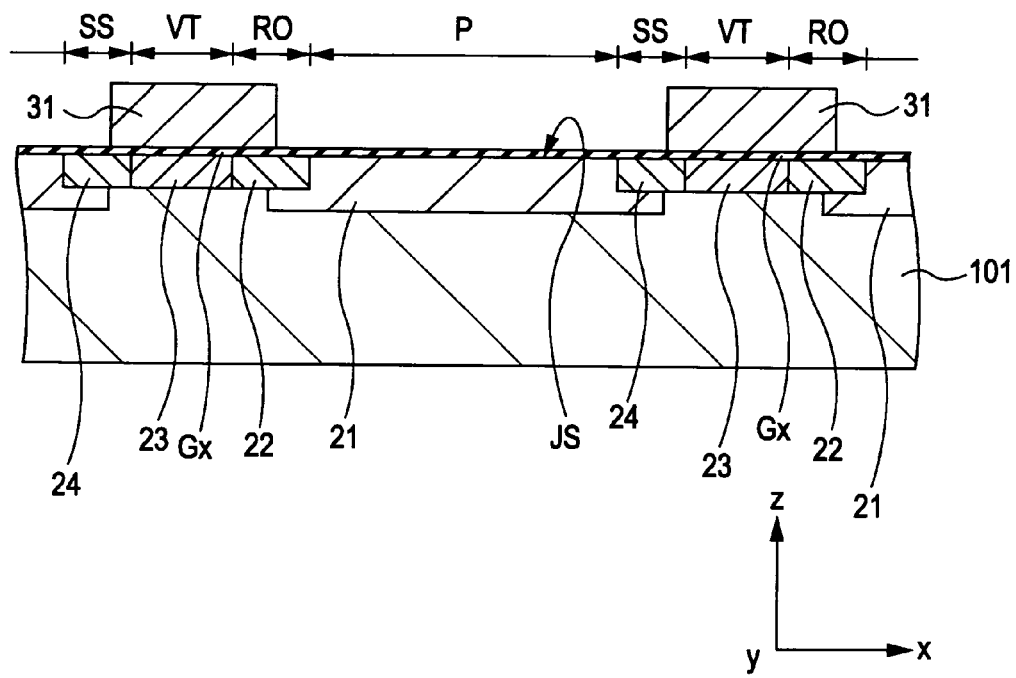
FIG. 10 shows the main part provided in each step of the method of manufacturing the solid-state imaging apparatus 1 according to the first embodiment of the present invention.
Figure 11:
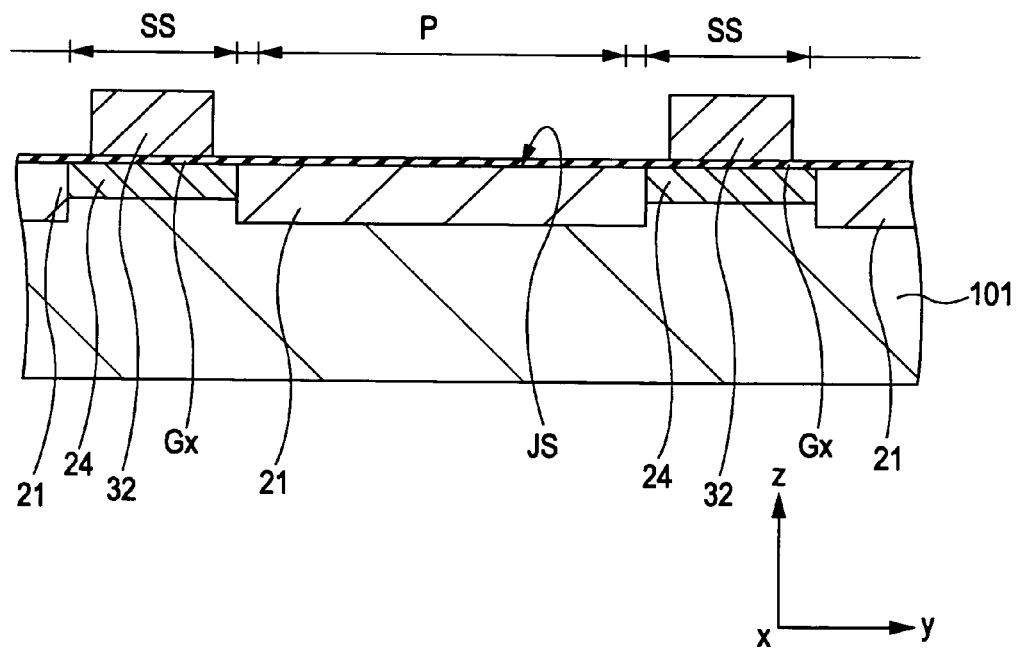
FIG. 11 shows the main part provided in each step of the method of manufacturing the solid-state imaging apparatus 1 according to the first embodiment of the present invention.

Next, as shown in FIGS. 10 and 11, a first transfer electrode 31 and a second transfer electrode 32 are formed.

At this point, on the surface of the substrate 101, the first transfer electrode 31 and the second transfer electrode 32 are formed using a conductive material so as to oppose with the gate insulating film Gx provided therebetween. For example, after a polysilicon film (not shown) is formed by a CVD process, the first transfer electrode 31 and the second transfer electrode 32 are formed by performing pattern processing on the polysilicon film by photo-lithography technology.

In the present embodiment, as shown in FIG. 4 above, both the plurality of first transfer electrodes 31 and the plurality of second transfer electrodes 32 are provided so as to be alternately arranged side by side at intervals in the vertical direction y. At this point, the first transfer electrodes 31 are provided so as to be provided between the plurality of photodiodes 21 arranged in the horizontal direction x. Furthermore, the second transfer electrodes 32 are provided so as to extend in the horizontal direction x between the plurality of photodiodes 21 arranged in the vertical direction y.

More specifically, as shown in FIG. 10, in the cross section in the horizontal direction x, the first transfer electrode 31 is provided so as to oppose the electric charge readout channel area 22, the electric charge transfer channel area 23, and the channel stopper area 24 with the gate insulating film Gx provided therebetween.

Then, as shown in FIG. 11, in the cross section in the vertical direction y, the second transfer electrode 32 is provided so as to oppose the channel stopper area 24 with the gate insulating film Gx provided therebetween.

Figure 12:
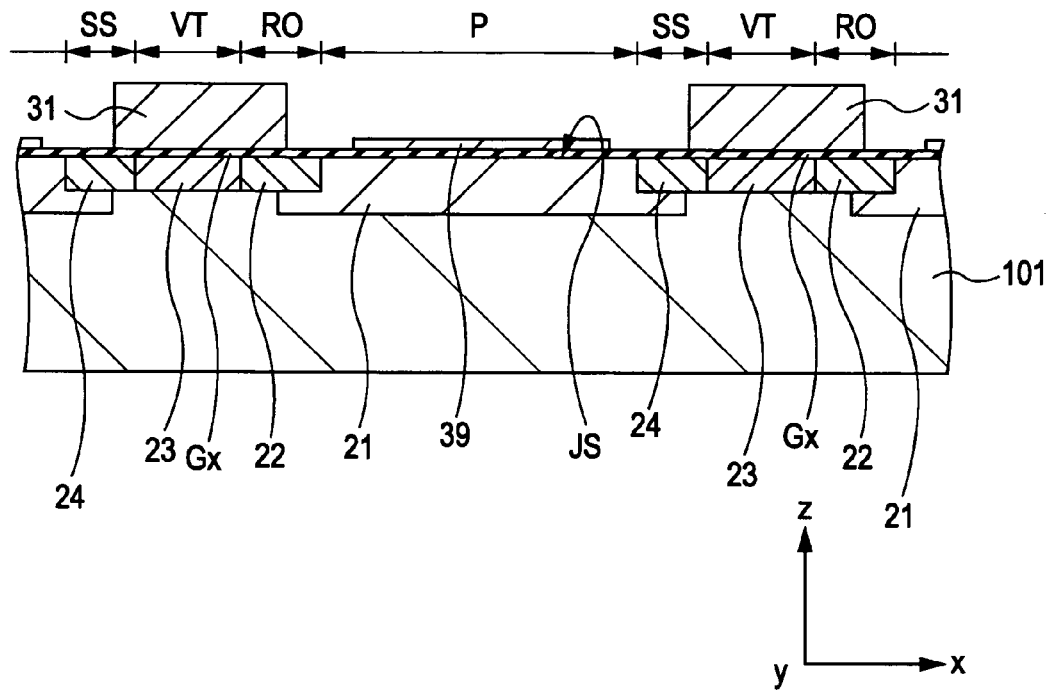
FIG. 12 shows the main part provided in each step of the method of manufacturing the solid-state imaging apparatus 1 according to the first embodiment of the present invention.
Figure 13:
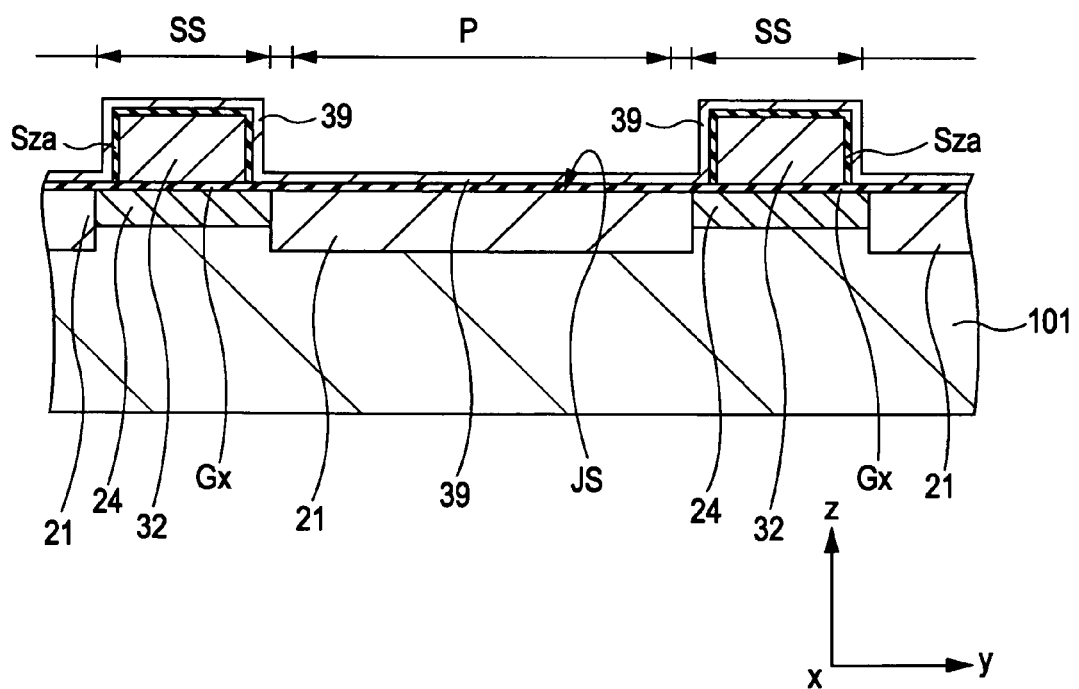
FIG. 13 shows the main part provided in each step of the method of manufacturing the solid-state imaging apparatus 1 according to the first embodiment of the present invention.

Next, as shown in FIGS. 12 and 13, a reflection prevention film 39 is formed.

At this point, as shown in FIG. 5 above, on the top surface of the substrate 101, a reflection prevention film 39 is provided so as to include a portion provided between the plurality of photodiodes 21 arranged in the horizontal direction x. Together with this, the reflection prevention film 39 is provided so as to cover the area positioned in the central portion and extend over the plurality of photodiodes 21 arranged in the vertical direction y.

More specifically, as shown in FIG. 12, in the cross section in the horizontal direction x, the reflection prevention film 39 is provided so as to be positioned above the central portion in the light-receiving surface JS of the photodiode 21.

Furthermore, as shown in FIG. 13, in the cross section in the vertical direction y, together with the light-receiving surface JS of the photodiode 21, the reflection prevention film 39 is provided so as to cover the second transfer electrode 32 with the insulating film Sza provided therebetween.

For this reason, in the present embodiment, first, in the cross section in the vertical direction y, the insulating film Sza is formed so as to cover the top surface and the side surface of the second transfer electrode 32. For example, after a silicon oxide film is formed by a CVD process, by performing pattern processing thereon using photo-lithography technology, the insulating film Sza is formed.

After that, after a silicon-nitride film is formed on the entire surface, for example, by a CVD process, the reflection prevention film 39 is formed by performing pattern processing thereon by using photo-lithography technology.

Figure 14:
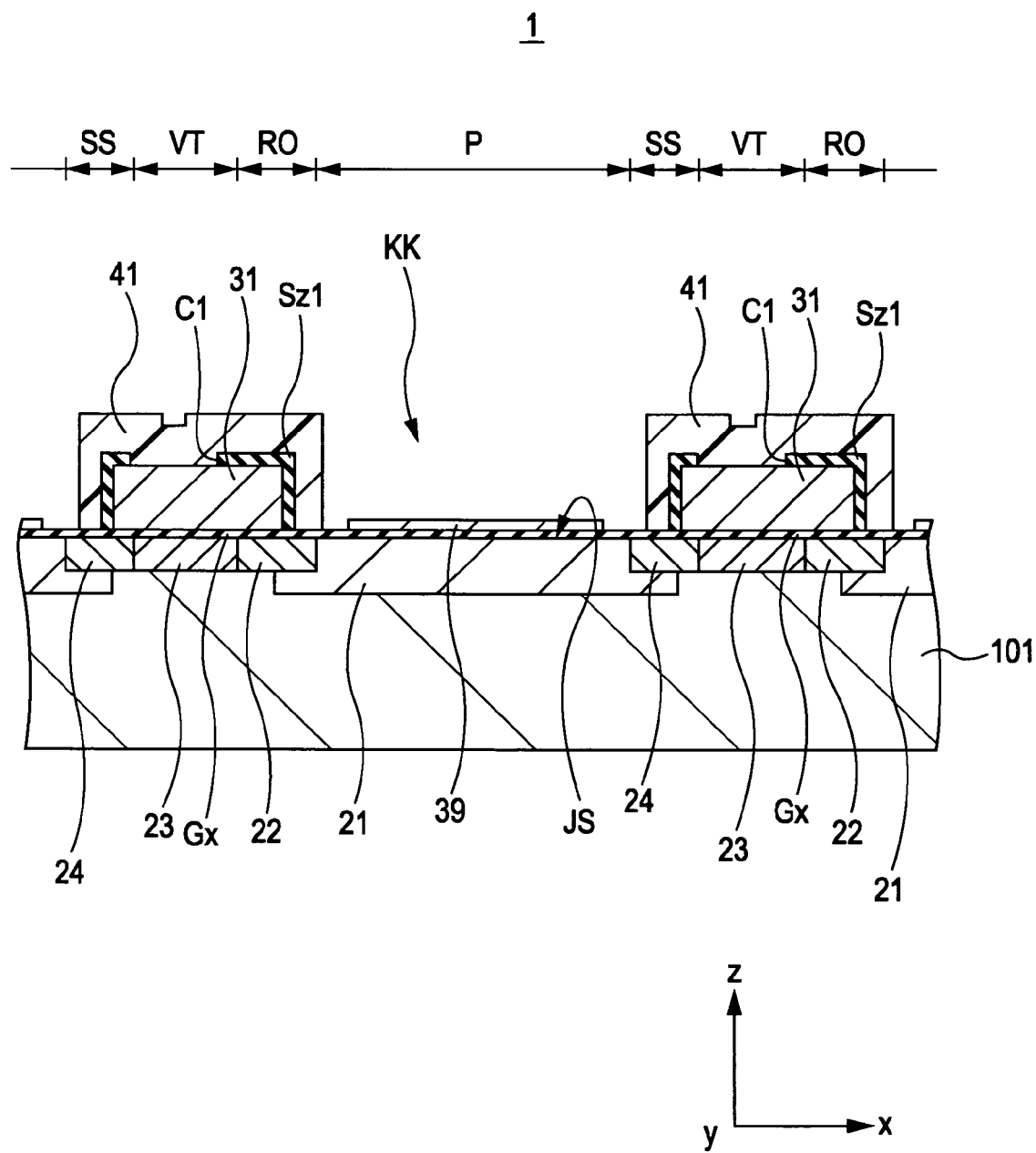
FIG. 14 shows the main part provided in each step of the method of manufacturing the solid-state imaging apparatus 1 according to the first embodiment of the present invention.
Figure 15:
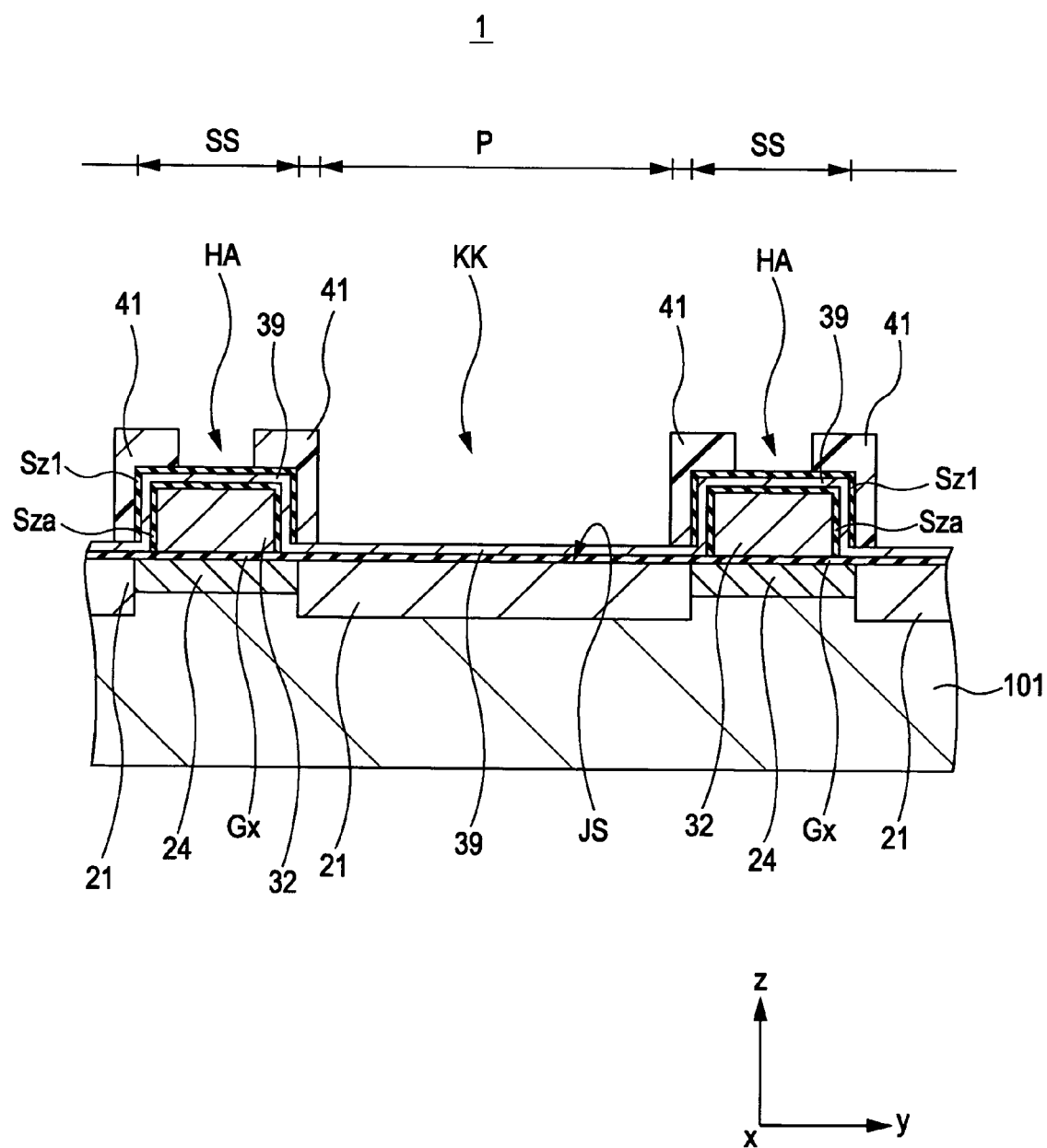
FIG. 15 shows the main part provided in each step of the method of manufacturing the solid-state imaging apparatus 1 according to the first embodiment of the present invention.

Next, as shown in FIGS. 14 and 15, a first light-shielding film 41 is formed.

At this point, the first light-shielding film 41 is formed on the surface of the substrate 101.

Figure 16:
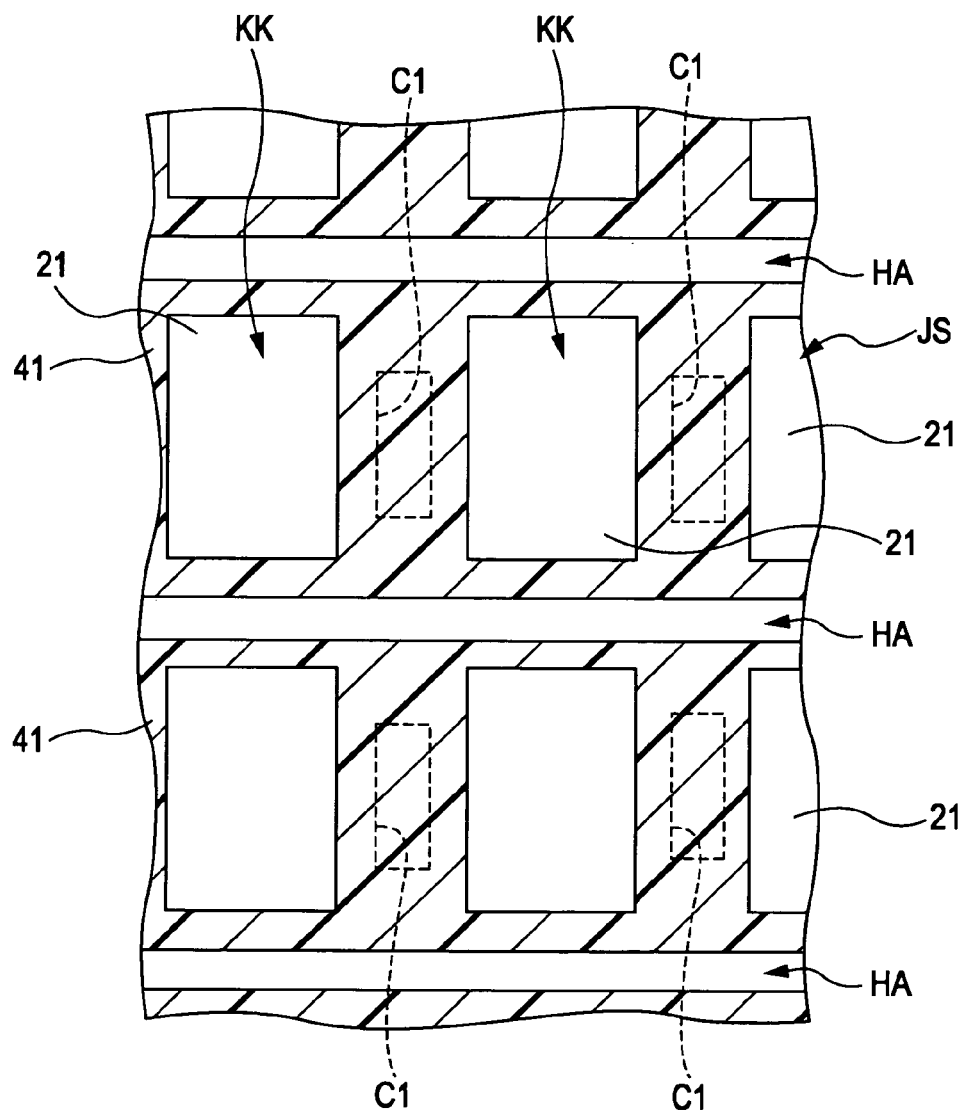
FIG. 16 is a top plan view showing a first light-shielding film 41 in an enlarged manner, which is provided on the surface of the substrate 101, according to the first embodiment of the present invention.

FIG. 16 is a top plan view showing the first light-shielding film 41 provided on the surface of the substrate 101 in an enlarged manner according to the first embodiment of the present invention.

As shown in FIG. 16, in the vertical direction y of the top surface of the substrate. 101, the first light-shielding film 41 is provided so as to be arranged with a slit HA therebetween. More specifically, in correspondence with the rows of the plurality of photodiodes 21 arranged in the horizontal direction x, the first light-shielding film 41 is provided so as to extend in the horizontal direction x. Furthermore, on the first light-shielding film 41, an opening KK is formed in a portion corresponding to the light-receiving surface JS of the photodiode 21.

Furthermore, in the cross section in the horizontal direction x as shown in FIG. 14, the first light-shielding film 41 is provided so as to cover the side surface and the top surface of the first transfer electrode 31 with the insulating film Sz1 provided therebetween, which covers the first transfer electrode 31. Then, here, on the top surface of the first transfer electrode 31, the first light-shielding film 41 is provided so as to be electrically connected by the first transfer electrode 31 via the contact C1 provided so as to go through the insulating film Sz1. Furthermore, in the cross section in the horizontal direction x, the first light-shielding film 41 is provided so as to include a portion that opposes the electric charge readout channel area 22 with the gate insulating film Gx provided therebetween.

On the other hand, in the cross section in the vertical direction y, as shown in FIG. 15, the first light-shielding film 41 is provided so as to cover the side surface and the top surface of the second transfer electrode 32 with the layers Sza, 39, and Sz1 provided therebetween.

For this reason, in the present embodiment, as shown in FIGS. 14 and 15, the insulating film Sz1 is formed so as to cover the first transfer electrode 31 and cover the second transfer electrode 32 with the reflection prevention film 39 provided therebetween. For example, after a silicon oxide film is formed by a CVD process, the insulating film Sz1 is formed by etching the silicon oxide film by using photo-lithography technology. Here, as shown in FIG. 14, a contact hole in which the contact C1 is provided is formed in the insulating film Sz1.

After that, after a tungsten film is formed, for example, by a sputtering method so that the contact hole is buried, the first light-shielding film 41 is formed by performing pattern processing on the tungsten film.

Next, as shown in FIG. 3 above, the second light-shielding film 42 is formed.

Here, as shown in FIG. 6 above, the second light-shielding film 42 is provided so as to extend in the horizontal direction x among the plurality of photodiodes 21 arranged in the vertical direction y. That is, the second light-shielding film 42 is provided so as to be provided among the rows of the plurality of photodiodes 21 arranged in the horizontal direction x and so as to cover the slit HA positioned among the plurality of first light-shielding films 41.

More specifically, as shown in FIG. 3, in the cross section in the vertical direction y, the second light-shielding film 42 is provided so as to extend in the horizontal direction x and so as to be positioned over the second transfer electrode 32 and the first light-shielding film 41 with the interlayer insulating film Sz2 provided therebetween. Then, at this point, on the top surface of the second transfer electrode 32, the second light-shielding film 42 is provided so as to be electrically connected to the second transfer electrode 32 via the contact C2 that is provided so as to go through the insulating films Sza, 39, and Sz1, and the interlayer insulating film Sz2.

In the present embodiment, first, as shown in FIG. 3, the interlayer insulating film Sz2 is formed on the surface of the substrate 101 by, for example, forming a silicon oxide film so as to cover the first light-shielding film 41.

After that, as shown in FIG. 3, a contact hole in which the contact C2 is provided is formed in the interlayer insulating film Sz2.

Then, after a tungsten film is formed, for example, by a sputtering method so that the contact hole is buried, the second light-shielding film 42 is formed by performing pattern processing on the tungsten film.

Thereafter, after a planarization film FT is formed on the surface of the substrate 101, a color filter (not shown) and a microlens (not shown) are sequentially provided, thereby completing the solid-state imaging apparatus 1.

As described above, in the present embodiment, in the image-sensing area PA of the substrate 101, in the vertical transfer register units VT, the first transfer electrode 31 opposes the electric charge readout channel area 22 together with the electric charge transfer channel area 23 with the gate insulating film Gx provided therebetween. Then, in the light-shielding unit SB, the first light-shielding film 41 is formed so as to cover the first transfer electrode 31 and include a portion that opposes the electric charge readout channel area 22 with the gate insulating film Gx provided therebetween. Here, the first light-shielding film 41 is formed using a conductive material and is electrically connected to the first transfer electrode 31.

For this reason, in the charge reading unit RO, the first transfer electrode 31 and the first light-shielding film 41 are used as charge reading electrodes, making it possible to read signal charge from the photodiode 21.

Therefore, in the present embodiment, since the first light-shielding film 41 is formed to oppose the electric charge readout channel area 22, it is possible to widen the opening KK of the light-shielding unit SB to extend outside the photodiode 21.

Furthermore, in the present embodiment, the second transfer electrodes 32 that oppose the area other than the area to which the first transfer electrodes 31 oppose in the electric charge transfer channel area 23 are alternately arranged side by side with the first transfer electrode 31. Furthermore, in the light-shielding unit SB, the second light-shielding film 42 formed using a conductive material is electrically connected to the second transfer electrode 32.

For this reason, in the vertical transfer register unit VT, as a charge transfer wire, it is possible for the first light-shielding film 41 to transmit a drive pulse signal to the first transfer electrode 31, and it is possible for the second light-shielding film 42 to transmit a drive pulse signal to the second transfer electrode 32.

Therefore, in the present embodiment, since the first light-shielding film 41 and the second light-shielding film 42 are configured to function as electric charge transfer wire in addition to the light-shielding function, it is possible to widen the opening KK of the light-shielding unit SB to extend outside the photodiode 21.

Therefore, in the present embodiment, it is possible to increase the area of the light-receiving surface per pixel, and it is possible to improve the quality of a captured image.

Second Embodiment

Apparatus Configuration

Figure 17:
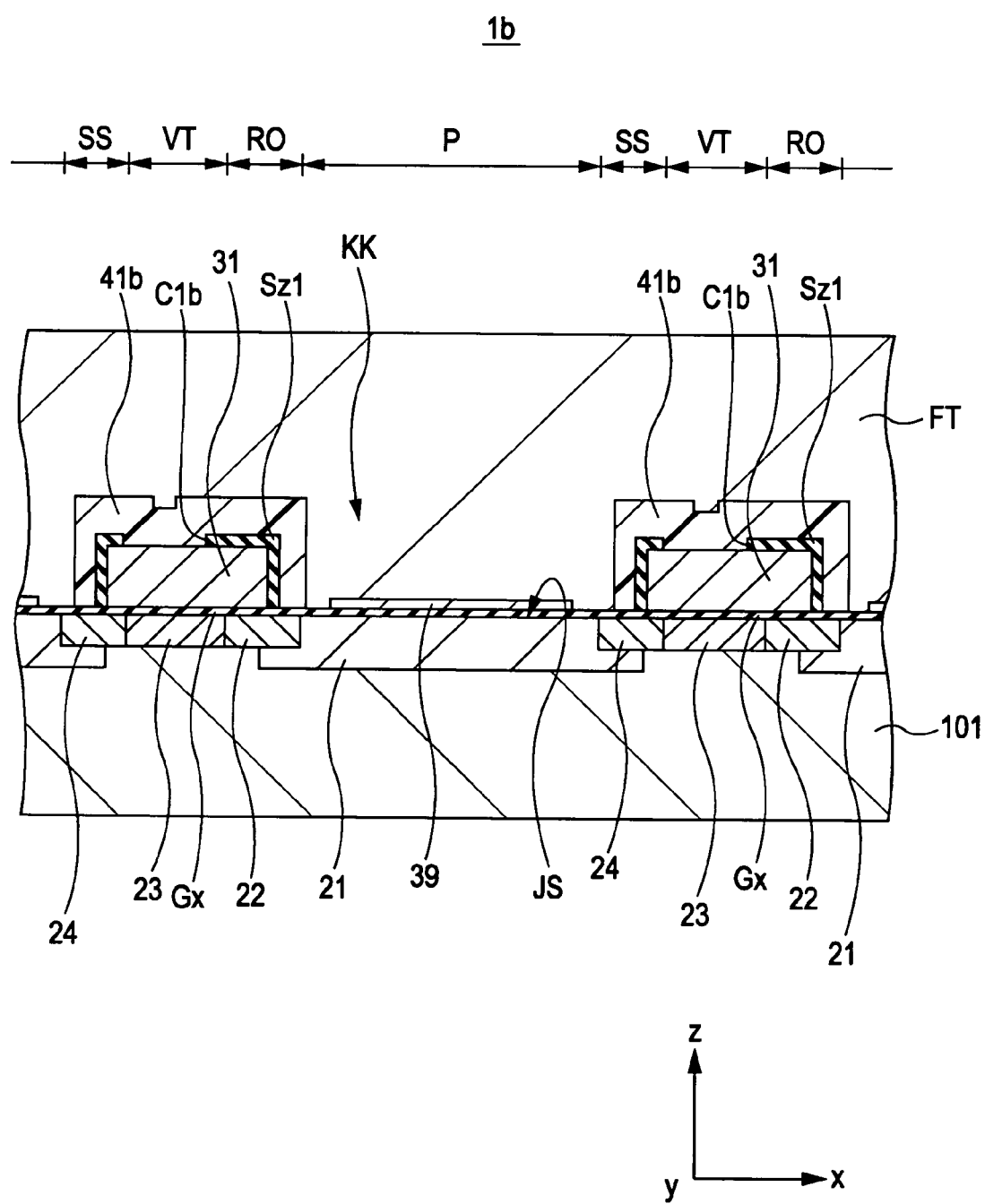
FIG. 17 shows the main part of a solid-state imaging apparatus 1b according to a second embodiment of the present invention.
Figure 18:
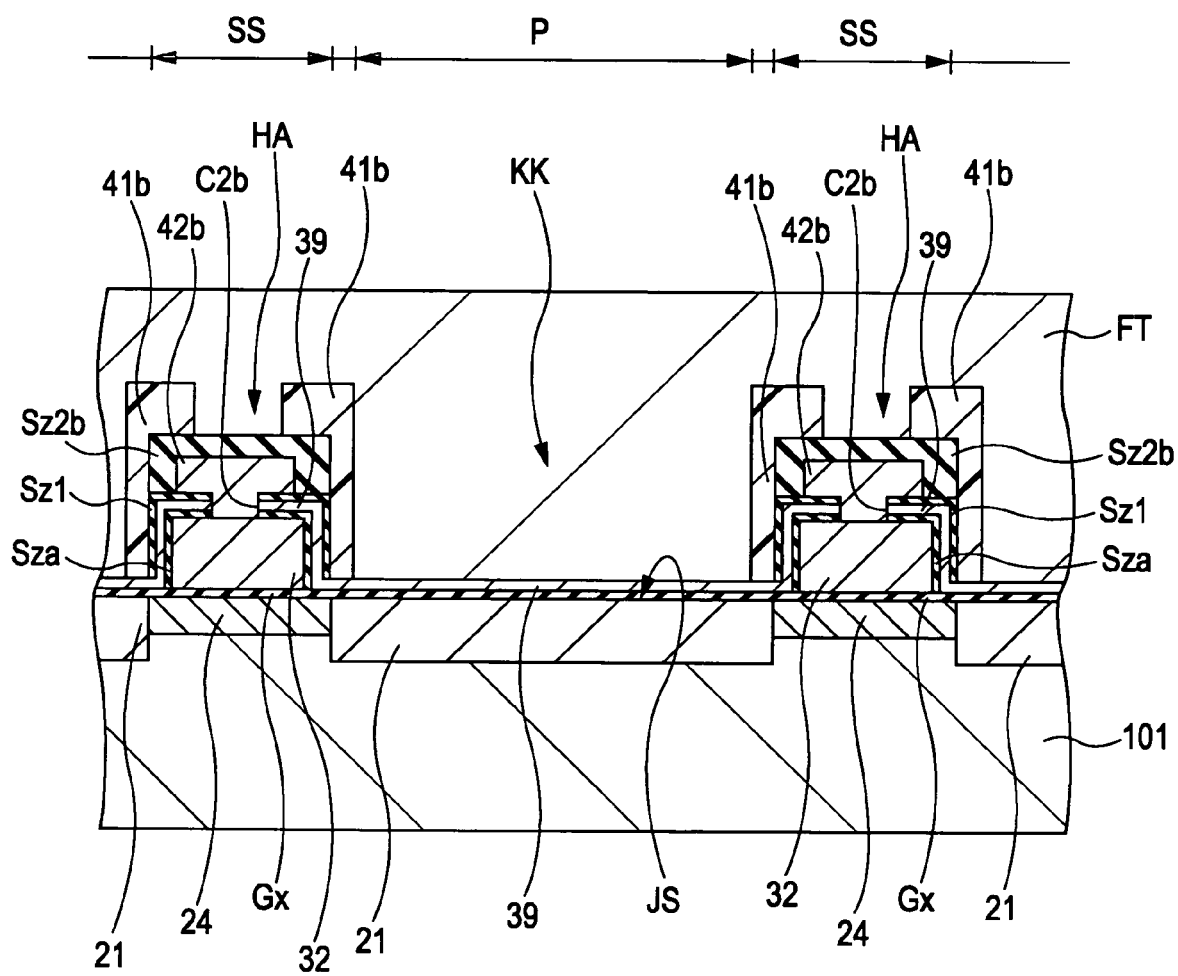
FIG. 18 shows the main part of the solid-state imaging apparatus 1b according to the second embodiment of the present invention.

FIGS. 17 and 18 show main parts of a solid-state imaging apparatus 1b according to a second embodiment of the present invention. Here, FIGS. 17 and 18 each show a cross section of the main part. FIG. 17 shows a portion corresponding to an II-II portion of FIG. 1 in an enlarged manner. FIG. 18 shows a portion corresponding to a portion of FIG. 1 in an enlarged manner.

Figure 19:
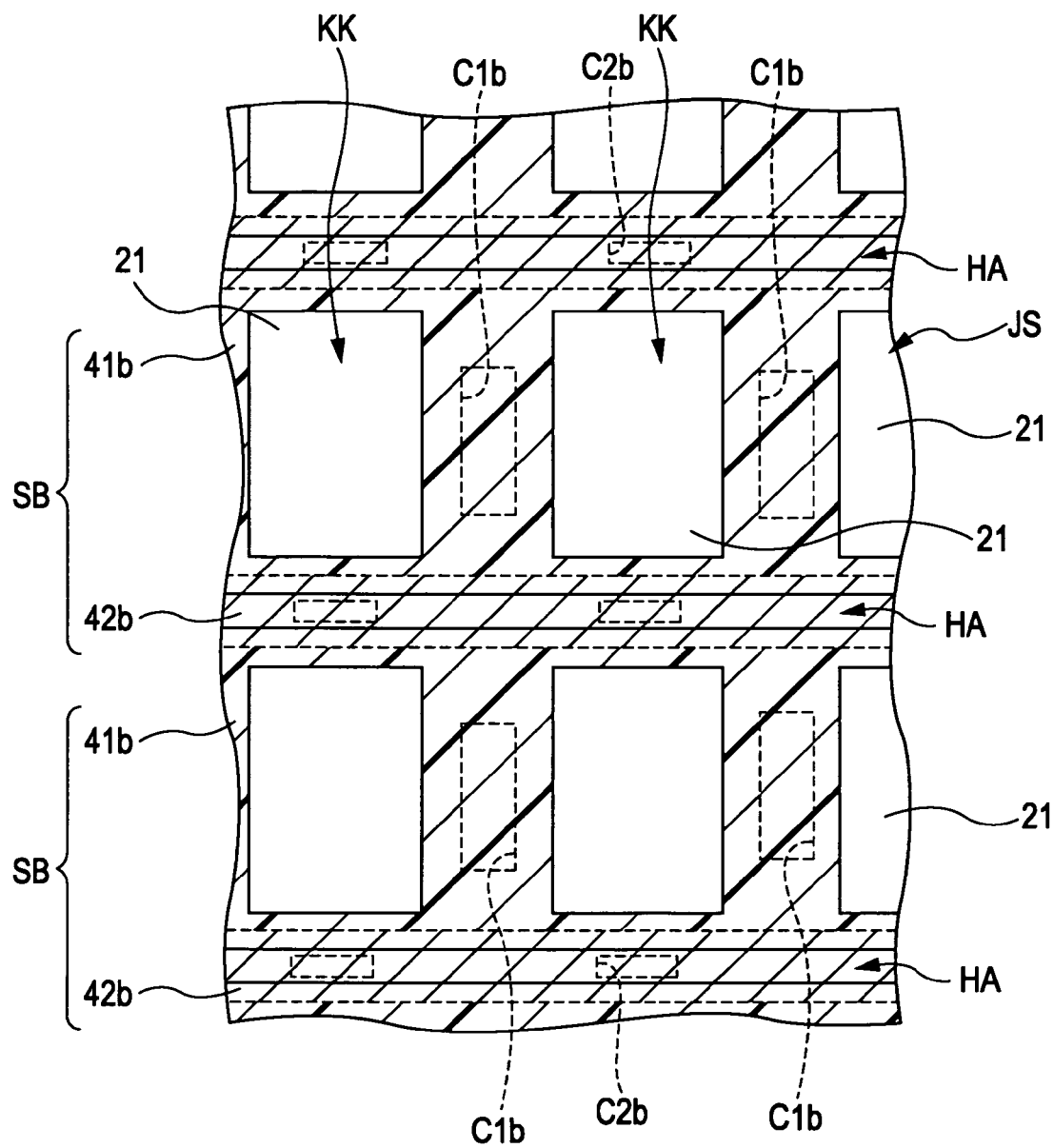
FIG. 19 is a top plan view showing a first light-shielding film 41b and a second light-shielding film 42b in an enlarged manner, which are provided on the surface of the substrate 101 according to the second embodiment of the present invention.

FIG. 19 is a top plan view showing a first light-shielding film 41b and a second light-shielding film 42b in an enlarged manner, which are provided on the surface of the substrate 101, according to the second embodiment of the present invention. In FIG. 19, for the convenience of description, the first light-shielding film 41b, the second light-shielding film 42b, and the photodiode 21 are shown, and descriptions of the remaining members are omitted.

As shown in FIGS. 17, 18 and 19, in the present embodiment, in the cross section in the vertical direction y, the position of the solid-state imaging apparatus 1b, at which the first light-shielding film 41b and the second light-shielding film 42b are provided, differs from that in the first embodiment. The present embodiment is the same as the first embodiment except for this point. For this reason, descriptions of the duplicate portions are omitted.

As shown in FIGS. 17, 18 and 19, unlike the first embodiment, the light-shielding unit SB is formed so as to include a portion in which the first light-shielding film 41b is formed on the second light-shielding film 42b.

More specifically, as shown in FIG. 17, in the cross section in the horizontal direction x, similarly to the first embodiment, the first light-shielding film 41b is provided so as to cover the side surface and the top surface of the first transfer electrode 31 with the insulating film Sz1 provided therebetween, which covers the first transfer electrode 31. Then, here, on the top surface of the first transfer electrode 31, the first light-shielding film 41b is provided so as to be electrically connected to the first transfer electrode 31 via the contact C1 provided so as to go through the insulating film Sz1.

However, in the cross section in the vertical direction y, unlike the first embodiment, as shown in FIG. 18, the first light-shielding film 41b is provided on the second light-shielding film 42b so as to cover the second transfer electrode 32 and the second light-shielding film 42b. Here, the first light-shielding film 41b is provided so as to cover the side surface of the second transfer electrode 32 with the insulating film Sza, the reflection prevention film 39, and the insulating film Sz1 at the side surface part provided therebetween. Furthermore, on the top surface portion, the first light-shielding film 41b is provided so as to cover the top surface of the second light-shielding film 42b with a insulating film Sz2b provided therebetween.

On the other hand, in the cross section in the vertical direction y, as shown in FIG. 18, the second light-shielding film 42b is provided so as to cover the second transfer electrode 32 with the insulating film Sza, the reflection prevention film 39, and the insulating film Sz1 provided therebetween on the top surface of the second transfer electrode 32. Here, as shown in FIG. 18, the second light-shielding film 42b is provided so as to extend in the horizontal direction x and so as to correspond to a slit HA positioned among the plurality of first light-shielding films 41b below the first light-shielding film 41b. Then, in the second light-shielding film 42b, the contact C2 is provided so as to go through the layers Sza, 39, and Sz1 that cover the second transfer electrode 32 and is electrically connected to the second transfer electrode 32.

Manufacturing Method

A method of manufacturing the solid-state imaging apparatus 1b will be described below.

Figure 20:
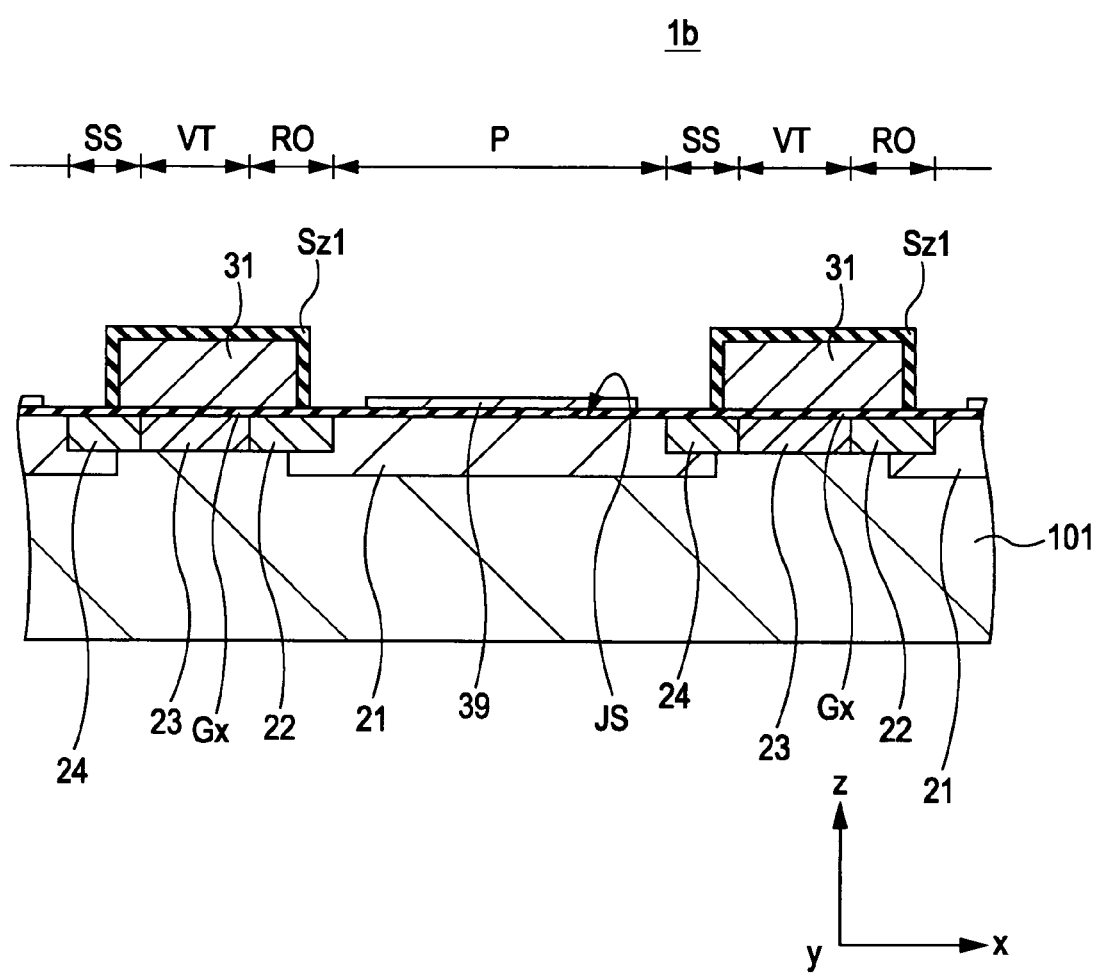
FIG. 20 shows the main part provided in each step of the method of manufacturing the solid-state imaging apparatus 1b according to the second embodiment of the present invention.
Figure 21:
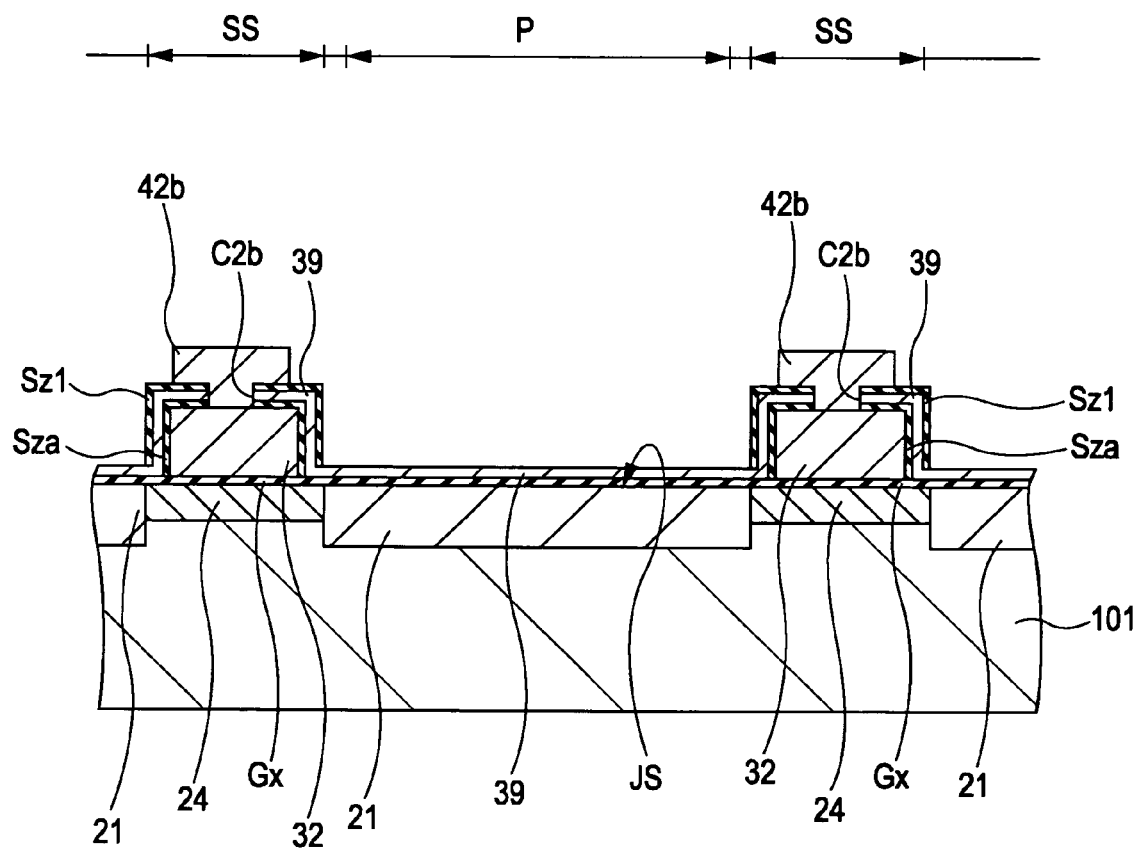
FIG. 21 shows the main part provided in each step of the method of manufacturing the solid-state imaging apparatus 1b according to the second embodiment of the present invention.
Figure 22:
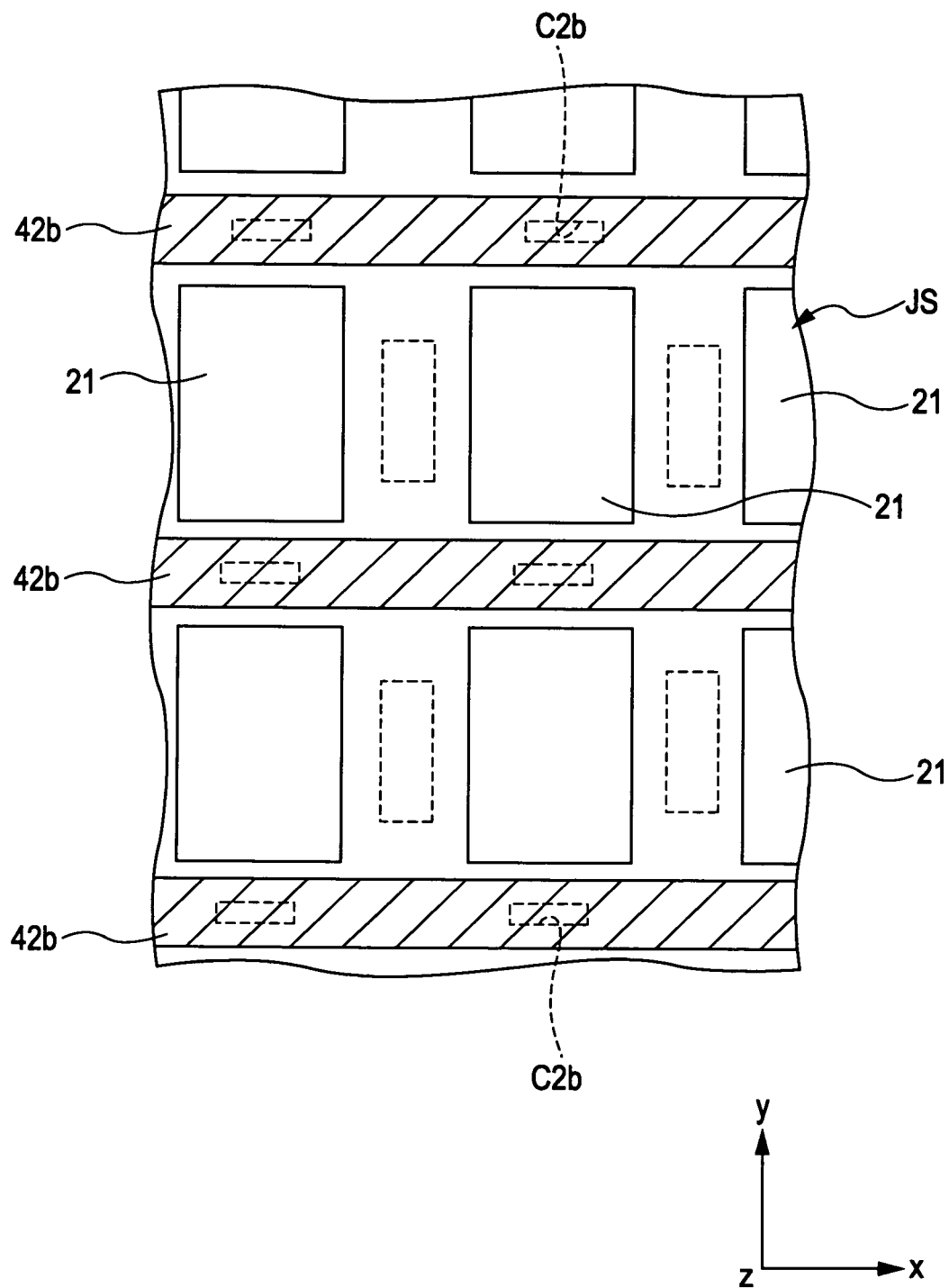
FIG. 22 shows the main part provided in each step of the method of manufacturing the solid-state imaging apparatus 1b according to the second embodiment of the present invention.

FIGS. 20, 21, and 22 show main parts provided in each step of a method of manufacturing the solid-state imaging apparatus 1b according to the second embodiment of the present invention. Similarly to FIG. 2, FIG. 20 shows a cross section showing a portion corresponding to an II-II portion of FIG. 1 in an enlarged manner. Similarly to FIG. 3, FIG. 21 shows a cross section showing a portion corresponding to a portion of FIG. 1 in an enlarged manner. FIG. 22 is a top plan view showing the second light-shielding film 42b provided on the surface of the substrate 101 in an enlarged manner according to the second embodiment of the present invention. In FIG. 22, for the convenience of description, the second light-shielding film 42b and the photodiode 21 are shown, and descriptions of the remaining members are omitted.

In the present embodiment, the reflection prevention film 39 is formed as described with reference to FIGS. 12 and 13 in the first embodiment.

After that, in the present embodiment, unlike the first embodiment, before the first light-shielding film 41b is formed, the second light-shielding film 42b is formed, as shown in FIGS. 20, 21 and 22.

Here, as shown in FIG. 22, on the top surface of the substrate 101, the second light-shielding film 42b is provided so as to extend in the horizontal direction x among the rows of the photodiodes 21 arranged in the horizontal direction x. Furthermore, the second light-shielding film 42b is provided so as to be arranged at intervals.

More specifically, as shown in FIGS. 20 and 21, first, the insulating film Sz1 is formed so as to cover the first transfer electrode 31 and also cover the second transfer electrode 32 with the reflection prevention film 39 provided therebetween. For example, after a silicon oxide film is formed, the insulating film Sz1 is formed by etching the silicon oxide film by using photo-lithography technology.

Then, as shown in FIG. 21, in the cross section in the vertical direction y, a contact hole in which a contact C2b is provided is formed so as to go through the layers Sza, 39, and Sz1. After that, after a tungsten film is formed, for example, by a sputtering method so that the contact hole is buried, the second light-shielding film 42b is formed by performing pattern processing on the tungsten film.

Next, as shown in FIGS. 17, 18 and 19, the first light-shielding film 41 is formed.

Here, as shown in FIG. 19, in the vertical direction y on the top surface of the substrate 101, the first light-shielding film 41b is provided so as to be arranged with a slit HA therebetween. More specifically, in correspondence with the rows of the plurality of photodiodes 21 arranged in the horizontal direction x, the first light-shielding film 41b is provided so as to extend in the horizontal direction x. Furthermore, in the first light-shielding films 41b, an opening KK is formed in a portion corresponding to the light-receiving surface JS of the photodiode 21.

More specifically, as shown in FIGS. 17 and 18, first, the insulating film Sz2b is formed so as to cover the top surface of the reflection prevention film 39 with the insulating film Sz1 provided therebetween. For example, after a silicon oxide film is formed, the insulating film Sz2b is formed by etching a silicon oxide film by using photo-lithography technology.

Then, as shown in FIG. 17, in the cross section in the horizontal direction x, a contact hole in which a contact C1b is provided is formed so as to go through the insulating film Sz1. After that, after a tungsten film is formed, for example, by a sputtering method so that the contact hole is buried, the first light-shielding film 41b is formed by performing pattern processing on the tungsten film.

After that, after a planarization film FT is formed on the surface of the substrate 101, a color filter (not shown) and a microlens (not shown) are provided in sequence, thereby completing the solid-state imaging apparatus 1b.

As described above, in the present embodiment, similarly to the first embodiment, in the vertical transfer register unit VT, the first transfer electrode 31 opposes the electric charge transfer channel area 23 and the electric charge readout channel area 22 with the gate insulating film Gx provided therebetween in the image-sensing area PA of the substrate 101. Then, in the light-shielding unit SB, the first light-shielding film 41b is formed so as to include a portion that covers the first transfer electrode 31 and opposes the electric charge readout channel area 22 with the gate insulating film Gx provided therebetween. Here, the first light-shielding film 41b is formed using a conductive material and is electrically connected to the first transfer electrode 31.

For this reason, in the charge reading unit RO, it is possible to read signal charge from the photodiode 21 by using the first transfer electrode 31 and the first light-shielding film 41b as charge reading electrodes.

Therefore, in the present embodiment, since the first light-shielding film 41b is formed to oppose the electric charge readout channel area 22, it is possible to widen the opening KK of the light-shielding unit SB to extend outside the photodiode 21.

Furthermore, in the present embodiment, in the light-shielding unit SB, similarly to the first embodiment, the second light-shielding film 42b formed using a conductive material is electrically connected to the second transfer electrode 32. For this reason, in the vertical transfer register unit VT, it is possible for the first light-shielding film 41b, serving as a charge transfer wire, to transmit a drive pulse signal to the first transfer electrode 31. Also, it is possible for the second light-shielding film 42b to transmit a drive pulse signal to the second transfer electrode 32.

Therefore, in the present embodiment, since the first light-shielding film 41b and the second light-shielding film 42b are formed so as to function as charge transfer wires in addition to the light-shielding function, it is possible to widen the opening KK of the light-shielding unit SB to extend outside the photodiode 21.

Therefore, in the present embodiment, similarly to the first embodiment, it is possible to increase the area of the light-receiving surface per pixel, thereby making it possible to improve the quality of a captured image.

Third Embodiment

Figure 23:
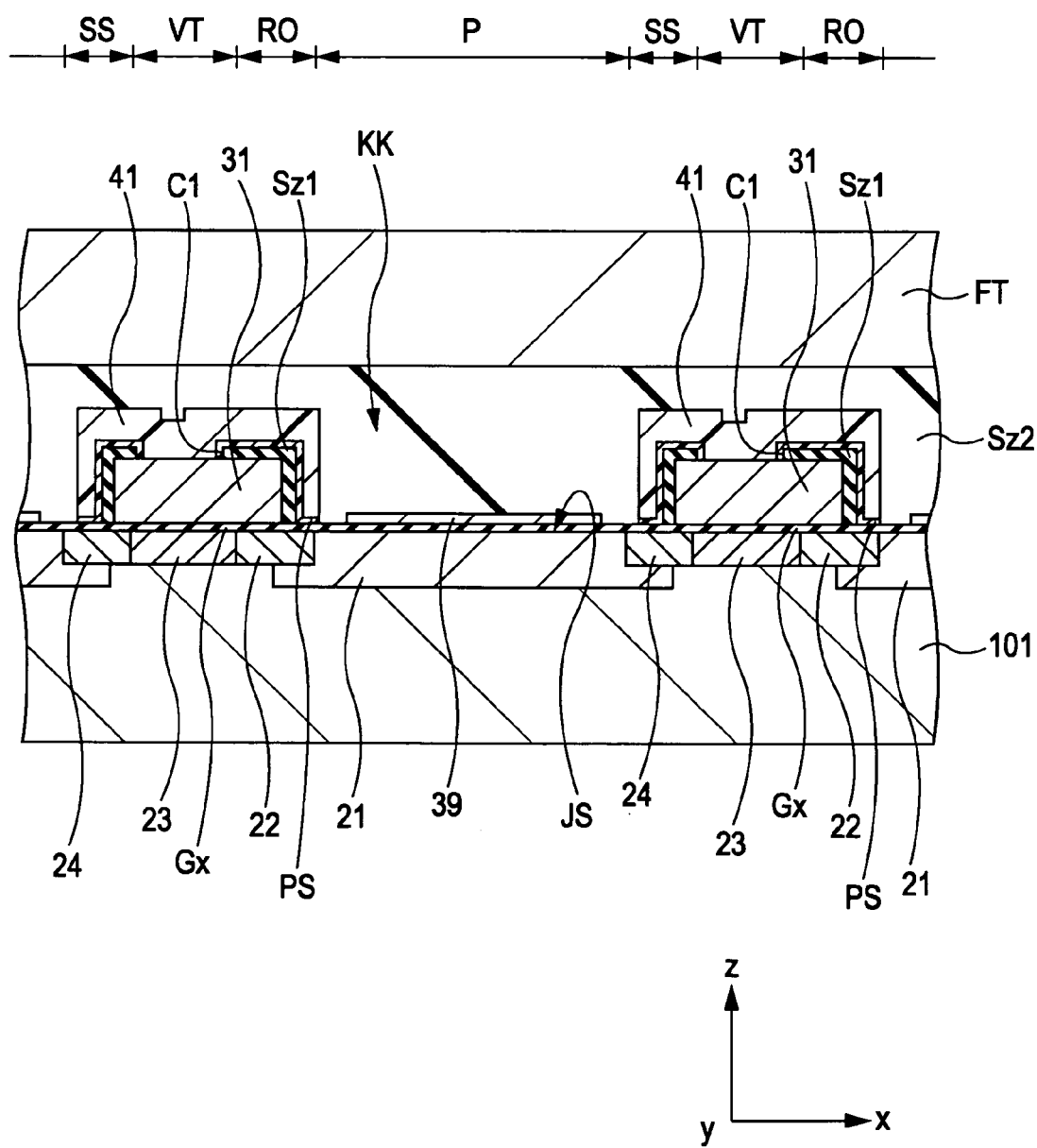
FIG. 23 shows the main part provided in each step of the method of manufacturing a solid-state imaging apparatus 1c according to a third embodiment of the present invention.

FIG. 23 shows the main part of a solid-state imaging apparatus 1c according to a third embodiment of the present invention. Here, FIG. 23 shows the cross section of the main part, also showing a portion corresponding to the II-II portion of FIG. 1 in an enlarged manner.

As shown in FIG. 23, in the present embodiment, the solid-state imaging apparatus 1c differs from that of the first embodiment in that a polysilicon film PS is further provided. The present embodiment is the same as the first embodiment except for this point. Accordingly, descriptions of the duplicate members are omitted.

As shown in FIG. 23, a polysilicon film PS is provided so as to cover the under surface of the first light-shielding film 41. The polysilicon film PS is formed so as to have a film thickness of, for example, approximately 30 nm.

As described in the first embodiment, since the first light-shielding film 41 uses a metal material, such as tungsten, a leak may occur. However, in the present embodiment, a leak is prevented from occurring by providing a polysilicon film PS having conductivity lower than that of the first light-shielding film 41.

Therefore, in the present embodiment, since a reading operation and a transfer operation can be performed appropriately, it is possible to improve the quality of a captured image.

The embodiments of the present invention are not limited to the above-described embodiments, and various modifications can be adopted.

For example, in the above-described embodiments, the case of a CCD image sensor employing an interline transfer method has been described, but the embodiments are not limited to this. For example, the present invention can be applied to various image sensors, such as a CCD image sensor employing a frame interline transfer method.

In the above-described embodiments, the solid-state imaging apparatuses 1, 1b, and 1c correspond to the solid-state imaging apparatus of the present invention; the substrate 101 corresponds to the substrate of the present invention; the image-sensing area PA corresponds to the image-sensing area of the present invention; the light-receiving surface JS corresponds to the light-receiving surface of the present invention; the photoelectric conversion unit P corresponds to the photoelectric conversion unit of the present invention; the electric charge readout channel area 22 corresponds to the electric charge readout channel area of the present invention; the charge reading unit RO corresponds to the charge reading unit of the present invention; the electric charge transfer channel area 23 corresponds to the electric charge transfer channel area of the present invention; the vertical transfer register unit VT corresponds to the transfer register unit of the present invention; the light-shielding unit SB corresponds to the light-shielding unit of the present invention; the opening KK corresponds to the opening of the present invention; the gate insulating film Gx corresponds to the gate insulating film of the present invention; the first transfer electrode 31 corresponds to the transfer electrode and the first transfer electrode of the present invention; the second transfer electrode 32 corresponds to the second transfer electrode of the present invention; the vertical direction y corresponds to the vertical direction of the present invention; the horizontal direction x corresponds to the horizontal direction of the present invention; the first light-shielding film 41 and the first light-shielding film 41b correspond to the first light-shielding film and the conductive light-shielding film of the present invention; the second light-shielding film 42 and the second light-shielding film 42b correspond to the second light-shielding film of the present invention; and the polysilicon film PS corresponds to the polysilicon film of the present invention.

The present application contains subject matter related to that disclosed in Japanese Priority Patent Application JP 2008-268544 filed in the Japan Patent Office on Oct. 17, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging apparatus comprising:
a plurality of photoelectric conversion units configured to generate signal charge from light received at light-receiving surfaces thereof, the plurality of photoelectric conversion units being provided in an image-sensing area of a substrate;
a charge reading unit configured to read signal charge generated by the photoelectric conversion units, the charge reading unit including a plurality of electric charge readout channel areas provided in the image-sensing area of the substrate with each electric charge reading area corresponding to one of the photoelectric conversion units;
a transfer register unit configured to transfer signal charge read from the plurality of photoelectric conversion units by the charge reading unit, the transfer register unit including a plurality of electric charge transfer channel areas provided in the image-sensing area of the substrate; and
a light-shielding unit that is provided in the image-sensing area of the substrate and that has a plurality of openings through which light is transmitted, each opening being formed in an area corresponding to a light-receiving surface of a respective photoelectric conversion unit,
wherein the transfer register unit includes a plurality of transfer electrodes disposed in the image-sensing area of the substrate such that the transfer electrodes oppose, in a direction perpendicular to the substrate, the electric charge transfer channel areas and the electric charge readout channel areas, with a gate insulating film provided therebetween,
wherein the light-shielding unit includes a conductive light-shielding film that covers the transfer electrodes in the image-sensing area of the substrate, and that is formed using a conductive material so as to include, for each photoelectric conversion unit, a portion opposing, in a direction perpendicular to the substrate, the corresponding electric charge readout channel area with the gate insulating film provided therebetween, wherein said portion of the light-shielding unit that opposes the corresponding electric charge readout channel area is disposed in such a manner that it functions as a charge reading electrode, and that is electrically connected to the transfer electrodes, and
wherein, in the charge reading unit, respective ones of the transfer electrodes and the conductive light-shielding film are formed as charge reading electrodes and together read signal charge from the photoelectric conversion units.

2. The solid-state imaging apparatus according to claim 1, wherein the plurality of photoelectric conversion units are arranged in a vertical direction and in a horizontal direction in the image-sensing area of the substrate in a matrix shape,
wherein each electric charge transfer channel area is arranged between a pair of adjacent vertical columns of the plurality of photoelectric conversion units arranged in the vertical direction, and
wherein the conductive light-shielding film extends in the horizontal direction so as to correspond to rows of the plurality of photoelectric conversion units arranged in the horizontal direction, with a plurality of openings formed therein through which light is transmitted, each opening being formed in an area corresponding to a light-receiving surface of a respective photoelectric conversion unit.

3. The solid-state imaging apparatus according to claim 2, wherein,
the conductive light-shielding film includes a plurality of first light-shielding films extending in the horizontal direction, each corresponding to a row of photoelectric conversion units with a horizontal slit between adjacent first light-shielding films, and
the light shielding unit includes a plurality of second light-shielding films extending in the horizontal direction, each being disposed between adjacent rows of photoelectric conversion units and covering one of the slits between first light-shielding films.

4. The solid-state imaging apparatus according to claim 3, wherein each second light-shielding film includes portions formed over adjacent first light-shielding films.

5. The solid-state imaging apparatus according to claim 1, wherein the transfer electrodes are formed using polysilicon, and the conductive light-shielding film is formed using tungsten.

6. The solid-state imaging apparatus according to claim 5, wherein a polysilicon film is formed on the under surface of the conductive light-shielding film.

7. A solid-state imaging apparatus comprising:
a plurality of photoelectric conversion units configured to generate signal charge from light received at light-receiving surfaces thereof, the plurality of photoelectric conversion units being provided in an image-sensing area of a substrate;
a charge reading unit configured to read signal charge generated by the photoelectric conversion units, the charge reading unit including a plurality of electric charge readout channel areas provided in the image-sensing area of the substrate with each electric charge reading area corresponding to one of the photoelectric conversion units;
a transfer register unit configured to transfer signal charge read from the plurality of photoelectric conversion units by the charge reading unit, the transfer register unit including a plurality of electric charge transfer channel areas provided in the image-sensing area of the substrate; and
a light-shielding unit that is provided in the image-sensing area of the substrate and that has a plurality of openings through which light is transmitted, each opening being formed in an area corresponding to a light-receiving surface of a respective photoelectric conversion unit,
wherein the transfer register unit includes a plurality of transfer electrodes disposed in the image-sensing area of the substrate such that the transfer electrodes oppose in a direction perpendicular to the substrate the electric charge transfer channel areas and the electric charge readout channel areas, with a gate insulating film provided therebetween,
wherein the light-shielding unit includes a conductive light-shielding film that covers the transfer electrodes in the image-sensing area of the substrate, and that is formed using a conductive material so as to include, for each photoelectric conversion unit, a portion opposing in a direction perpendicular to the substrate the corresponding electric charge readout channel area with the gate insulating film provided therebetween, and that is electrically connected to the transfer electrodes,
wherein, in the charge reading unit, the transfer electrodes and the conductive light-shielding film are formed as charge reading electrodes and read signal charge from the photoelectric conversion units,
wherein the plurality of photoelectric conversion units are arranged in a vertical direction and in a horizontal direction in the image-sensing area of the substrate in a matrix shape,
wherein each electric charge transfer channel area is arranged between a pair of adjacent vertical columns of the plurality of photoelectric conversion units arranged in the vertical direction,
wherein the conductive light-shielding film extends in the horizontal direction so as to correspond to rows of the plurality of photoelectric conversion units arranged in the horizontal direction, with a plurality of openings formed therein through which light is transmitted, each opening being formed in an area corresponding to a light-receiving surface of a respective photoelectric conversion unit
wherein, the conductive light-shielding film includes a plurality of first light-shielding films extending in the horizontal direction, each corresponding to a row of photoelectric conversion units with a horizontal slit between adjacent first light-shielding films,
wherein the light shielding unit includes a plurality of second light-shielding films extending in the horizontal direction, each being disposed between adjacent rows of photoelectric conversion units and covering one of the slits between first light-shielding films,
wherein, the transfer electrodes include:
a plurality of first transfer electrodes that oppose in a direction perpendicular to the substrate the electric charge transfer channel areas and the electric charge readout channel areas with a gate insulating film provided therebetween, and
a plurality of second transfer electrodes that oppose in a direction perpendicular to the substrate the electric charge transfer channel areas,
wherein for each of the electric charge transfer channel areas, the first transfer electrodes and the second transfer electrodes corresponding to the respective electric charge transfer channel area are alternately arranged side by side in the vertical direction,
wherein each second light-shielding film is formed using a conductive material and is electrically connected to at least one of the second transfer electrodes, and
wherein the transfer register unit is formed in such a manner that the first light-shielding films serve as charge transfer wires and transmit driving signals to the first transfer electrodes, and the second light-shielding films serve as charge transfer wires and transmit driving signals to the second transfer electrodes.

8. A solid-state imaging apparatus comprising:
a plurality of photoelectric conversion units configured to receive light at light-receiving surfaces thereof and generate signal charge by performing photoelectric conversion of the received light, the plurality of photoelectric conversion units being arranged in a horizontal direction and in a vertical direction in an image-sensing area of a substrate;
a charge reading unit that has a plurality of electric charge readout channel areas provided so as to correspond to the plurality of photoelectric conversion units in the image-sensing area of the substrate and that reads signal charge generated by the photoelectric conversion units in the electric charge readout channel area;
a transfer register unit that has a plurality of electric charge transfer channel areas, each electric charge transfer channel area being provided between adjacent columns of the plurality of photoelectric conversion units arranged in the vertical direction in the image-sensing area of the substrate, and that transfers, in the electric charge transfer channel areas, signal charge read from each of the plurality of photoelectric conversion units by the charge reading unit in the vertical direction; and a light-shielding unit that is formed using a conductive material in the image-sensing area of the substrate and that has a plurality of openings through which light is transmitted, each opening being provided in an area corresponding to a light-receiving surface of a respective photoelectric conversion unit, wherein the transfer register unit includes:
  a plurality of first transfer electrodes that oppose in a direction perpendicular to the substrate the electric charge transfer channel areas and the electric charge readout channel areas, with a gate insulating film provided therebetween, and
  a plurality of second transfer electrodes that oppose in a direction perpendicular to the substrate the electric charge transfer channel areas, wherein, for each of the electric charge transfer channel areas, the first transfer electrodes and the second transfer electrodes corresponding to the respective electric charge transfer channel area are alternately arranged side by side in the vertical direction, and wherein the light-shielding unit includes:
  a plurality of first light-shielding films that extend in a horizontal direction, each corresponding to a row of the plurality of photoelectric conversion units arranged in the horizontal direction and including, for each photoelectric conversion unit, a portion that opposes in a direction perpendicular to the substrate the corresponding electric charge readout channel area with a gate insulating film provided therebetween, wherein the first light-shielding films are electrically connected to the first transfer electrodes and are arranged in the vertical direction with a slit therebetween, and
  a plurality of second light-shielding films that extend in the horizontal direction, each being disposed between adjacent rows of the plurality of photoelectric conversion units arranged in the horizontal direction and covering one of the slits between first light-shielding films, wherein the second light-shielding films are electrically connected to the second transfer electrodes, wherein the charge reading unit is formed in such a manner that the first transfer electrodes and the first light-shielding films serve as charge reading electrodes so as to read signal charge from the photoelectric conversion units, and wherein the transfer register unit is formed in such a manner that the first light-shielding films, which serve as charge transfer wires, transmit a driving signal to the first transfer electrodes, and the second light-shielding films, which serve as charge transfer wires, transmit a driving signal to the second transfer electrodes.

9. A camera comprising the solid-state imaging apparatus of claim 1.

10. A method of manufacturing a solid-state imaging apparatus, the method comprising the steps of:
  forming, in an image-sensing area of a substrate, a plurality of photoelectric conversion units that receive light at light-receiving surfaces thereof and that generate signal charge by performing photoelectric conversion of the received light;
  forming, in the image-sensing area of the substrate, a charge reading unit that reads the signal charge generated by the photoelectric conversion units, the signal charge being read in a plurality of electric charge readout channel areas provided in the image-sensing area of the substrate with each electric charge reading area corresponding to one of the photoelectric conversion units;
  forming, in the image-sensing area of the substrate, a transfer register unit that transfers signal charge read from each of the plurality of photoelectric conversion units, the signal charge being transferred by a plurality of electric charge transfer channel areas provided in the image-sensing area of the substrate; and
  forming a light-shielding unit in the image-sensing area of the substrate so that a plurality of openings through which light is transmitted are formed in areas corresponding to the respective light-receiving surface of the photoelectric conversion unites, wherein the step of forming the transfer register unit includes a step of forming, in the image-sensing area of the substrate, a plurality of transfer electrodes that oppose in a direction perpendicular to the substrate the electric charge transfer channel areas and the electric charge readout channel areas with a gate insulating film provided therebetween, and wherein the step of forming the light-shielding unit includes a step of forming a conductive light-shielding film that covers the transfer electrode in the image-sensing area of the substrate and that is electrically connected to the transfer electrode so as to include, for each photoelectric conversion unit, a portion that opposes, in a direction perpendicular to the substrate, the corresponding electric charge readout channel area with a gate insulating film provided therebetween, where said portion of the light-shielding unit that opposes the corresponding electric charge readout channel area is disposed in such a manner that it functions as a charge reading electrode.

11. The solid-state imaging apparatus of claim 1,
wherein said portion of the light-shielding unit that opposes the corresponding electric charge readout channel area is disposed such that only the light shielding film is located between the portion of the light-shielding unit and the corresponding electric charge readout channel area.

12. The solid state imaging apparatus of claim 11,
wherein said plurality of transfer electrodes are disposed such that they only partially cover said electric charge readout channel areas, and
wherein said portion of the light-shielding unit that opposes the corresponding electric charge readout channel area is disposed over a portion of said electric charge readout channel area not covered by said transfer electrodes.

13. The solid state imaging apparatus of claim 1,
wherein said portion of the light-shielding unit that opposes the corresponding electric charge readout channel area is a portion that is formed on a side of said transfer electrodes.

14. The solid state imaging apparatus of claim 1,
wherein said portion of the light-shielding unit and said plurality of transfer electrodes are configured such, for a given photoelectric conversion unit, when a readout voltage is applied to the portion of the light-shielding unit that opposes the corresponding electric charge readout channel area and to the corresponding one of said transfer electrodes, charges accumulated in the given photoelectric conversion unit are transferred through the corresponding electric charge readout channel area to a corresponding one of the electric charge transfer channel areas.

\* \* \* \* \*